United States Patent
Cho et al.

(10) Patent No.: US 8,420,485 B2
(45) Date of Patent: Apr. 16, 2013

(54) SEMICONDUCTOR DEVICE HAVING VERTICAL CHANNEL TRANSISTOR AND METHOD OF MANUFACTURING THE SAME

(75) Inventors: Young-seung Cho, Yongin-si (KR); Dae-ik Kim, Yongin-si (KR); Yoo-sang Hwang, Suwon-si (KR); Hyun-woo Chung, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 24 days.

(21) Appl. No.: 13/243,174

(22) Filed: Sep. 23, 2011

(65) Prior Publication Data
US 2012/0094455 A1 Apr. 19, 2012

(30) Foreign Application Priority Data
Oct. 13, 2010 (KR) .................. 10-2010-0099842

(51) Int. Cl.
*H01L 21/336* (2006.01)
(52) U.S. Cl.
USPC .................................. 438/270; 257/E21.629
(58) Field of Classification Search ........... 257/E21.428, 257/E21.629
See application file for complete search history.

(56) References Cited

U.S. PATENT DOCUMENTS

| 7,355,230 B2 | 4/2008 | Thies et al. |
| 7,358,133 B2 * | 4/2008 | Lee .............................. 438/243 |
| 7,518,182 B2 | 4/2009 | Abbott et al. |
| 7,772,631 B2 * | 8/2010 | Schloesser .................... 257/296 |

FOREIGN PATENT DOCUMENTS

KR 1020090048013 5/2009

* cited by examiner

*Primary Examiner* — Chandra Chaudhari
(74) *Attorney, Agent, or Firm* — F. Chau & Associates, LLC

(57) ABSTRACT

A semiconductor device and method of manufacturing the same. The method includes: defining a first active area and a second active area on a substrate, the first and second active areas being in a line form, forming a first main trench and a second main trench on the substrate, forming a first sub-trench and a second sub-trench in bottoms of the first and second main trenches, respectively, forming a buried insulation layer filling the first and second sub-trenches, partially exposing the substrate at an area where the first active area crosses with the first sub-trench and an area where the second active area crosses with the second sub-trench and forming the first buried bit line and the second buried bit line on the buried insulation layer, and the first and second buried bit lines being extended in parallel to each other.

20 Claims, 34 Drawing Sheets

SEMICONDUCTOR DEVICE HAVING VERTICAL CHANNEL TRANSISTOR AND METHOD OF MANUFACTURING THE SAME

CROSS-REFERENCE TO RELATED APPLICATION

This application claims priority to Korean Patent Application No. 10-2010-0099842, filed on Oct. 13, 2010, the disclosure of which is hereby incorporated by reference herein in its entirety.

BACKGROUND

Exemplary embodiments of the inventive concept relate to a semiconductor device, and more particularly, to a semiconductor device including a vertical channel transistor and a method of manufacturing the same.

As semiconductor devices become more highly integrated, a design rule for elements of the semiconductor devices may be reduced. In particular, in a semiconductor device which requires a large number of transistors, a gate length as a standard of the design rule may be reduced and thereby a length of a channel may be reduced. In a transistor of a semiconductor device that is highly scaled, a vertical channel transistor is introduced so that a distance between a source and a drain increases so as to increase an effective channel length.

SUMMARY

According to an exemplary embodiment of the inventive concept, there is provided a method of manufacturing a semiconductor device, the method including: defining a first active area and a second active area on a substrate, the first and second active areas being in a line form extended in parallel to each other in a first direction, forming a first main trench and a second main trench on the substrate, and the first and second main trenches being extended in parallel to each other in a second direction that is perpendicular or substantially perpendicular to the first direction. The method further includes forming a first sub-trench and a second sub-trench in bottoms of the first and second main trenches, respectively, and the first and second sub-trenches being extended in parallel to each other in the second direction, forming a buried insulation layer for filling the first and second sub-trenches, partially exposing the substrate at an area where the first active area crosses with the first sub-trench and an area where the second active area crosses with the second sub-trench while the buried insulation layer remains below the area where the first active area crosses with the first sub-trench and the area where the second active area crosses with the second sub-trench and forming a first buried bit line and a second buried bit line on the buried insulation layer, and the first and second buried bit lines being extended in parallel to each other in the second direction.

A width of each of the first and second sub-trenches may be smaller than a width of each of the first and second main trenches.

An area where the first active area crosses with the first buried bit line and an area where the second active area crosses with the second buried bit line may correspond to contact areas, and the buried insulation layer formed on an area where the first active area crosses with the second sub-trench and an area where the second active area crosses with the first sub-trench may correspond to field areas.

The first buried bit line may be formed on the buried insulation layer in the first sub-trench in the first active area and the second buried bit line may be formed on the buried insulation layer in the second sub-trench in the second active area, and a depth from the upper surface to the lower surface of the first buried bit line may be larger than a depth from an upper surface to a lower surface of the second buried bit line in the.

The method may further include forming a first insulation layer having a first thickness on the inner side walls of the first and second main trenches before forming of the first and second sub-trenches.

The method may further include forming side wall insulation layers on inner side walls of the first and second sub-trenches before forming the buried insulation layer.

The partially exposing of the substrate at the area where the first active area crosses with the first sub-trench and the area where the second active area crosses with the second sub-trench while the buried insulation layer remains below the areas may include: forming a mask pattern on the substrate, on which the buried insulation layer is formed, for partially exposing an area where the first active area crosses with the first main trench and an area where the second active area crosses with the second main trench; and removing the buried insulation layer by a first depth by using the mask pattern as an etching mask at the area where the first active area crosses with the first sub-trench and the area where the second active area crosses with the second sub-trench.

The partially exposing of the substrate at the area where the first active area crosses with the first sub-trench and the area where the second active area crosses with the second sub-trench while the buried insulation layer remains below the area where the first active area crosses with the first sub-trench and the area where the second active area crosses with the second sub-trench may further include removing the buried insulation layer exposed on bottoms of the first main trench and the second main trench at the area where the first active area crosses with the first main trench and the area where the second active area crosses with the second main trench.

The partially exposing of the substrate at the area where the first active area crosses with the first sub-trench and the area where the second active area crosses with the second sub-trench while the buried insulation layer remains below the area where the first active area crosses with the first sub-trench and the area where the second active area crosses with the second sub-trench may further include partially removing the substrate adjacent to each of the first and second sub-trenches by the first depth at the area where the first active area crosses with the first sub-trench and the area where the second active area crosses with the second sub-trench.

The method may further include forming first source/drain areas by injecting impurities to bottoms of the first main trench in the first active area and the second main trench in the second active area each exposed by the mask pattern.

The method may further include dividing each of the first and second active areas into a plurality of active pillars by the first and second main trenches and forming second source/drains areas by injecting the impurities to the upper surfaces of the plurality of active pillars.

The method may further include: forming a gate insulation layer on one vertical side of each of the plurality of active pillars and forming a contact gate that faces the vertical side of one of the plurality of active pillars, the gate insulation layer being interposed between the contact gate and the vertical side of the one of the plurality of active pillars, and a word line connected to the contact gate and disposed on the substrate.

The method may further include: forming buried contact plugs on the second source/drains areas; and forming capacitor lower electrodes on the buried contact plugs.

According to an exemplary embodiment of the inventive concept, there is provided a method of manufacturing a semiconductor device, the method including: defining active areas on a substrate, and the active areas being in a line form extended in a first direction, forming main trenches on the substrate, the main trenches being extended in a second direction that is perpendicular or substantially perpendicular to the first direction, forming sub-trenches extended in the second direction in the bottoms of the main trenches by a predetermined depth. The method further includes forming a buried insulation layer filling the sub-trenches, partially exposing the substrate at an area where the active areas crosses with the sub-trenches while the buried insulation layer partially remains below the area where the active areas crosses with the sub-trenches and forming buried bit lines on the buried insulation layer, and the buried bit lines contacting the exposed substrate and being extended in the second direction.

A width of each of the sub-trenches may be smaller than a width of each of the first and second main trenches.

The method may further include forming first source/drain areas by injecting impurities to the exposed substrate. The method may further include dividing each of the active areas into a plurality of active pillars by the main trenches and forming second source/drains areas by injecting the impurities to the upper surfaces of the plurality of active pillars.

According to an exemplary embodiment of the inventive concept, there is provided a method of manufacturing a semiconductor device, the method including: defining first active area and a second active area on a substrate, the first and second active areas being in a line form extended in parallel to each other in a first direction, forming a first main trench and a second main trench on the substrate, the first and second main trenches being extended in parallel to each other in a second direction that is perpendicular or substantially perpendicular to the first direction, forming first a first sub-trench and a second sub-trench on bottoms of the first and second main trenches, respectively, the first and second sub-trenches being extended in parallel to each other in the second direction, and further etching the first and second sub-trenches by a first depth at an area where the first active area crosses with the second sub-trench and an area where the second active area crosses with the first sub-trench. The method further includes forming a buried insulation layer filling the first and second sub-trenches, partially exposing the substrate at an area where the first active area crosses with the first sub-trench and an area where the second active area crosses with the second sub-trench while the buried insulation layer remains below the area where the first active area crosses with the first sub-trench and the area where the second active area crosses with the second sub-trench and forming first a first buried bit line and a second buried bit line on the buried insulation layer, and the first and second buried bit lines being extended in parallel to each other in the second direction.

A width of each of the first and second sub-trenches may be smaller than a width of each of the first and second main trenches.

The method may further include forming a first insulation layer having a first thickness on the inner side walls of the first and second main trenches before forming of the first and second sub-trenches.

According to an exemplary embodiment of the inventive concept, there is provided a semiconductor device including: first and second active areas each including a plurality of active pillars that are spaced apart from each other on a substrate, first and second buried bit lines each crossing the first and second active areas through a space between two adjacent active pillars from among the plurality of active pillars at a level lower than the upper surface of the substrate and first and second buried insulation layers each disposed at bottoms of the first and second buried bit lines on the substrate. Moreover, a depth from the upper surface to the lower surface of the first buried bit line is larger in the first active area than that of the second active area, a depth from the upper surface to the lower surface of the second buried bit line is larger in the second active area than that of the first active area, a depth from the upper surface to the lower surface of the first buried insulation layer is larger in the second active area than that of the first active area, and a depth from the upper surface to the lower surface of the second buried insulation layer is larger in the first active area than that of the second active area.

An area where the first active area crosses with the first buried bit line and an area where the second active area crosses with the second buried bit line may correspond to contact areas, and the buried insulation layers formed on an area where the first active area crosses with the second sub-trench and an area where the second active area crosses with the first sub-trench may correspond to field areas.

The semiconductor device may further include: first source/drain areas formed around the first and second buried bit lines and second source/drains areas formed on each of the plurality active pillars.

The semiconductor device may further include: gate insulation layers covering vertical sides that provide channel areas on which vertical channels are each formed between the first source/drain areas and the second source/drains areas at each of the plurality active pillars, contact gates facing the vertical sides of each of the plurality active pillars with the gate insulation layer interposed between the contact gates and word lines connected to the contact gates and formed on the substrate.

According to an exemplary embodiment of the inventive concept, a method of manufacturing a semiconductor device is provided. The method includes forming a device isolation layer on a substrate defining a first active area and a second active area in the substrate, the first and second active areas being in a line form extended in parallel to each other in a first direction, sequentially forming a pad oxide film pattern and a first mask pattern each extended in parallel to each other in a second direction that is perpendicular or substantially perpendicular to the first direction on the device isolations layer and the first and second active areas, etching exposed portions of the device isolation layer and the first and second active areas using the first mask pattern as an etching mask to form a first main trench and a second main trench in the substrate, and the first and second main trenches being extended in parallel to each other in a second direction that is perpendicular or substantially perpendicular to the first direction and the first and second active areas are divided into a plurality of active pillars by the first and second main trenches. The method further includes forming a first insulation layer on the first mask pattern and in each of the first and second main trenches, removing exposed portions of the first insulation layer located on bottoms of the first and second main trenches and exposed portions of the first insulation layer located underneath the first mask patterns, over-etching the substrate using the first insulation layer remaining on sidewalls of the first and second main trenches as etching masks to thereby form a first sub-trench and a second sub-trench connected to and in bottoms of the first and second main trenches, respectively, the first and second sub-trenches being extended in parallel to each other in the second direction.

The method further includes removing the first insulating layer remaining on the sidewalls of the first and second main trenches, forming sidewall insulation layers on inner walls of the first and second sub-trenches, forming a second insulation layer on sidewalls of the first and second main trenches and along the sidewall insulation layers in the first and second sub-trenches to fill the first and second sub-trenches, forming a second mask pattern having an opening on the second insulation layer, wherein the opening partially exposes the substrate at an area where the first active area crosses with the first main-trench and an area where the second active area crosses with the second main trench; etching the second insulation layer formed at a bottom of the first main trench exposed by the second mask pattern and the opening, etching portions of the second insulating layer and the sidewall insulation layer each formed in the first sub-trench to thereby extend a depth of the first main trench and to expose the first active area adjacent to the first sub-trench, implanting impurity ions into the exposed first active area though the opening of the second mask pattern so that first source/drain areas are formed in the exposed first active area, removing the second mask pattern, forming a first buried bit line and a second buried bit line in each of the first main trench and the second main trench above the sidewall insulation layers and second insulation layer formed in the first sub-trench and the second sub-trench, forming a third insulation layer on the first and second buried bit lines to thereby fill the first main trench and the second main trench, removing the pad oxide film pattern and the first mask pattern from the substrate and forming second source/drains areas by injecting the impurities to upper surfaces of the plurality of active pillars.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF EXEMPLARY EMBODIMENTS

Figure 1:
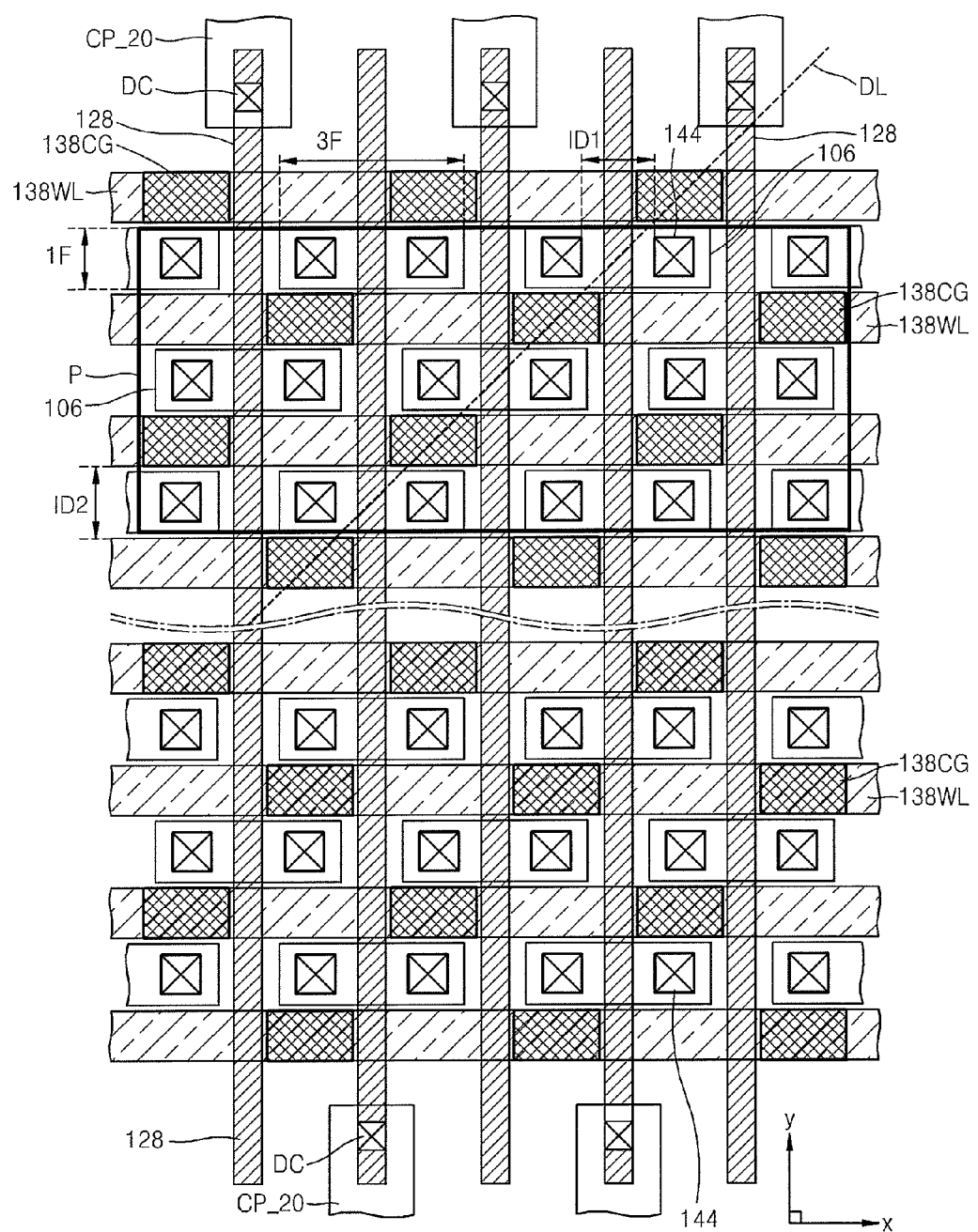
FIG. 1 is a layout schematically illustrating a semiconductor device according to an exemplary embodiment of the inventive concept.

Reference will now be made in detail to exemplary embodiments, examples of which are illustrated in the accompanying drawings. However, exemplary embodiments are not limited to the embodiments illustrated hereinafter In the description, when it is described that a layer is disposed on another layer, the layer may be directly disposed on the other layer or an intervening layer may be interposed therebetween. In the drawings, the thicknesses or size of layers are exaggerated for clarity. Like reference numerals in the drawings denote like elements. As used herein, the term "and/or" includes any and all combinations of one or more of the associated listed items.

FIG. 1 is a layout schematically illustrating a semiconductor device 100 according to an exemplary embodiment of the inventive concept. The layout of FIG. 1 may be applied to a dynamic random access memory (DRAM), in particular, to a DRAM cell having a unit cell size of $4F^2$. Here, 1F denotes a minimum feature size.

Figure 2A:
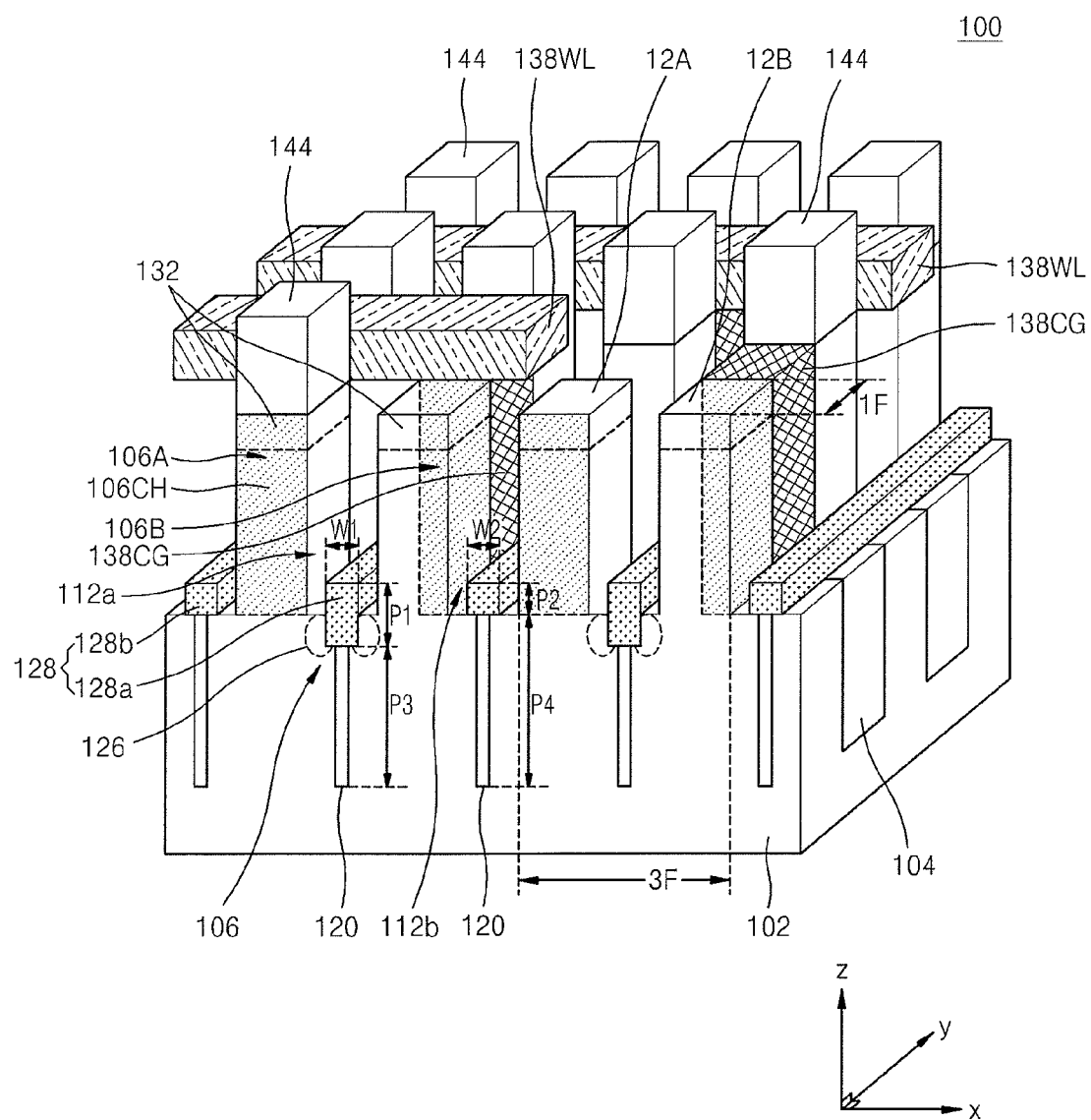
FIG. 2A is a partial perspective view illustrating the three-dimensional arrangement relationship between elements forming a cell array area in the semiconductor device of FIG. 1, according to an exemplary embodiment of the inventive concept.

FIG. 2A is a partial perspective view illustrating the three-dimensional arrangement relationship between elements forming a cell array area in the semiconductor device 100, according to an exemplary embodiment of the inventive concept.

Referring to FIGS. 1 and 2A, the semiconductor device 100 may include active areas 106 defined in a line form extending in a first direction (x-direction in FIG. 1) on a substrate 102. Here, the substrate 102 may be patterned, for example, in a line end space form and device isolation layers 104 are disposed in the space so that the active areas 106 may be defined in the line form. The active areas 106 may be divided into, for example, a plurality of active pillars 106A and 106B on the substrate 102 by the first main trenches 112a and the second main trenches 112b recessed from the center of the active areas 106 by a predetermined depth.

First source/drain areas 126 may be formed on areas where two adjacent active pillars 106A and 106B are separated in the active areas 106. The active pillars 106A and 106B may respectively have upper surfaces 12A and 12B that are spaced apart from each other, wherein the upper surfaces 12A and 12B of the active pillars 106A and 106B may each correspond to an upper surface of the substrate 102. Second source/drain areas 132 may be each formed on the upper surfaces 12A and 12B of the active pillars 106A and 106B.

A plurality of buried bit lines 128 may be extended in parallel to each other in a second direction (y-direction in FIG. 1) that is perpendicular or substantially perpendicular to the first direction in the substrate 102. The plurality of buried bit lines 128 may be disposed on, for example, bottom areas of the first main trenches 112a and the second main trenches 112b. The plurality of buried bit lines 128 may each include, for example, first and second buried bit lines 128a and 128b, and depths from the upper surfaces to the lower surfaces of the first and second buried bit lines 128a and 128b may be different from each other according to positions thereof.

For example, a first depth P1 of the first buried bit line 128a may be larger than a second depth P2 of the second buried bit line 128b in one active area 106. For example, the first depth P1 may be double the second depth P2. Also, the first depth P1 may be, for example, smaller than the second depth P2 in the other active area 106 adjacent to the one active area 106. The first depth P1 and the second depth P2 may be, for example, the same as each other in the device isolation layers 104.

The first buried bit line 128a and the second buried bit line 128b may each have a regular width. A first width W1 of the first buried bit line 128a and a second width W2 of the second buried bit line 128b may be, for example, substantially the same as each other.

A plurality of buried insulation layers 120 may be disposed on the bottoms of the first and second buried bit lines 128a and 128b. The plurality of buried insulation layers 120 may include, for example, first buried insulation layers 120 disposed at the bottom of the first buried bit lines 128a and second buried insulation layers 120 disposed at the bottom of the second buried bit lines 128b, and depths from the upper surfaces to the lower surfaces of the first 120 and second 120 buried insulation layers may be different from each other according to positions thereof.

For example, a third depth P3 of the first buried insulation layer 120 may be smaller than a fourth depth P4 of the second buried insulation layer 120 in one active area 106. For example, the first depth P1 may be double the second depth P2. Also, the third depth P3 may be, for example, larger than the fourth depth P4 in the other active area 106 adjacent to the one active area 106. The third depth P3 and the fourth depth P4 may be, for example, the same as each other in the device isolation layers 104.

Here, an area where the active area 106 crosses with the first buried bit line 128a and an area where the other active area 106 crosses with the second buried bit line 128b may correspond to contact areas. Also, an area where the active area 106 crosses with the second buried insulation layer 120 and an area where the other active area 106 crosses with the first buried insulation layer 120 may correspond to field areas. Accordingly, the active areas 106 disposed at both sides of the field area may be insulated from each other.

According to the current embodiment of the inventive concept, the first 120 and second 120 buried insulation layers may function as the field areas according to the positions thereof so that an additional device isolation layer may not be formed in an extending direction of the active areas 106. Accordingly, a trim photoresist process for the active areas 106 is not required and thus an overall manufacturing process may be simplified.

The active pillars 106A and 106B in the active areas 106 may include vertical sides 106CH that provide channel areas on which vertical channels are each formed, wherein the vertical sides 106CH may face contact gates 138CG. The vertical sides 106CH of two adjacent active pillars 106A and 106B may face opposite to each other. Vertical channels may be each formed on the vertical sides 106CH between the first source/drain areas 126 and the second source/drain areas 132.

The active pillars 106A and 106B included in the active areas 106 may each constitute an independent unit memory cell. Two unit memory cells respectively realized in two adjacent active pillars 106A and 106B may share the first source/drain areas 126 formed around the bottoms of the active areas 106.

A plurality of word lines 138WL on the substrate 102 may be extended in parallel to each other in a direction (x-direction in FIG. 1) perpendicular or substantially perpendicular to an extending direction of the plurality of buried bit lines 128. The plurality of word lines 138WL may be electrically connected to the plurality of contact gates 138CG arranged in a line along an extending direction (x-direction in FIG. 1) of the plurality of word lines 138WL. The plurality of word lines 138WL may be integrally formed with the plurality of contact gates 138CG arranged in a line along an extending direction of the plurality of word lines 138WL. Also, the plurality of word lines 138WL and the plurality of contact gates 138CG arranged in a line along an extending direction of the plurality of word lines 138WL may be formed as different layers formed by different deposition process each and that may directly contact each other.

As illustrated in FIG. 1, one contact gate 138CG may be disposed in each area between two adjacent active areas 106 in a direction between the x-direction and the y-direction, for example, an oblique line direction DL of FIG. 1. Also, a unit memory cell including the active pillar 106A included in one active area 106 may share the contact gate 138CG with a unit memory cell including the active pillar 106B included in the other active area 106.

A plurality of buried contact plugs 144 may be each formed on the second source/drain areas 132 formed on the plurality of active pillars 106A and 106B. Lower electrodes (not illustrated) of capacitors may be respectively formed on the plurality of buried contact plugs 144.

In the forming of the memory cell array having a unit memory cell size of $4F^2$ illustrated in FIGS. 1 and 2A, the plurality of buried bit lines 128 formed in the substrate 102 are included so that although a high-voltage bias is applied in the semiconductor device 100 having a vertical channel transistor structure with a fine unit cell size due to high-integration, the bias does not adversely affect the vertical channel areas. Also, an insulation distance ID1 may be secured between two adjacent buried contact plugs 144, viewing from an extending direction of the word lines 138WL (x-direction in FIG. 1). In addition, an insulation distance ID2 may be secured between two adjacent word lines 138WL, viewing from an extending direction of the buried bit lines 128 (y-direction in FIG. 1).

In the semiconductor device 100 of FIGS. 1 and 2A, one of the ends of each the plurality of buried bit lines 128 formed on cell array areas may be electrically connected to a core/peri bit line CP_20 formed at peripheral circuit areas or core areas (hereinafter, referred to as "core/peri areas"). Here, the core/peri bit lines CP_20 may be formed on the substrate 102. Accordingly, to electrically connect the core/peri bit lines CP_20 to the buried bit lines 20, direct contacts (DC) extended in a vertical direction (z-direction in FIG. 2A) between the core/peri bit lines CP_20 and the buried bit lines 128 may be used at edges of the cell array areas.

Figure 2B:
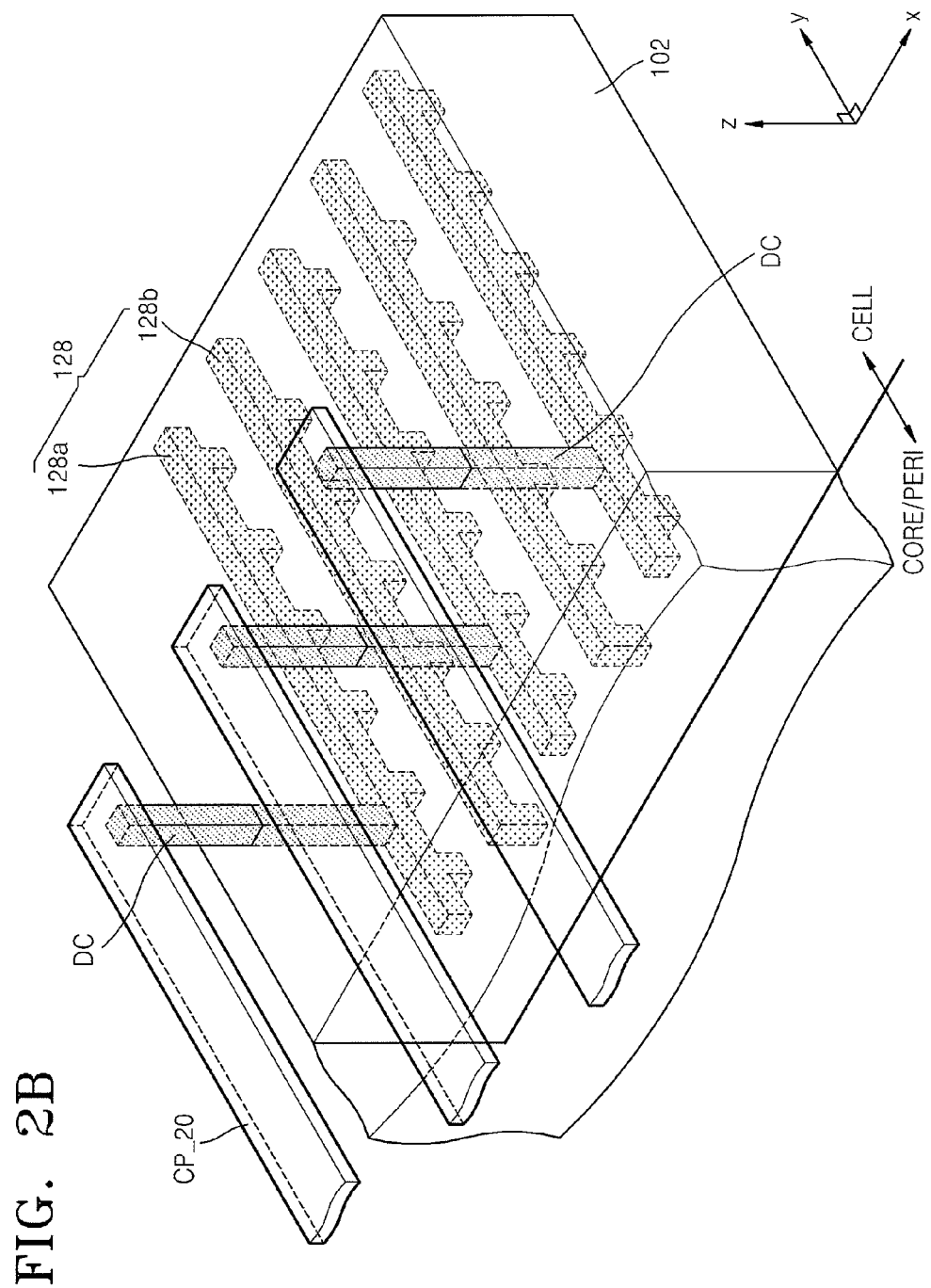
FIG. 2B is a partial perspective view schematically illustrating the arrangement relationship between bit lines in the semiconductor device of FIG. 2A.

FIG. 2B is a partial perspective view schematically illustrating the arrangement relationship between the bit lines in the semiconductor device 100 of FIG. 2A.

Referring to FIG. 2B, the plurality of buried bit lines 128 in the substrate 102 are formed to be lower than the upper surface of the substrate 102 and the plurality of core/peri bit lines CP_20 may be formed to be higher than the upper surface of the substrate 102. In this regard, the direct contact DC may be extended from the inside of the substrate 102 to the upside of the substrate 102 in a vertical direction with respect to an extending direction of the upper surface of the substrate 102. The word lines 138WL illustrated in FIGS. 1 and 2A may be disposed between a first level where the plurality of buried bit lines 128 are disposed and a second level where the plurality of core/peri bit lines CP_20 are disposed.

FIGS. 3A through 13C are schematic diagrams sequentially illustrating a method of manufacturing the semiconductor device 100 of FIG. 2A, according to an exemplary embodiment of the inventive concept. In particular, FIGS. 3A, 4A, . . . , and 13A are plane views of an area of a rectangle "P" in FIG. 1. FIGS. 3B, 4B, . . . , and 13B are cross-sectional views of the area along lines BX1-BX1' and BX2-BX2' of FIGS. 3A, 4A, . . . , and 13A. FIGS. 3C, 4C, . . . , and 13C are cross-sectional views of the area along lines CY1-CY1' and CY2-CY2' of FIGS. 3A, 4A, . . . , and 13A.

Figure 3A:
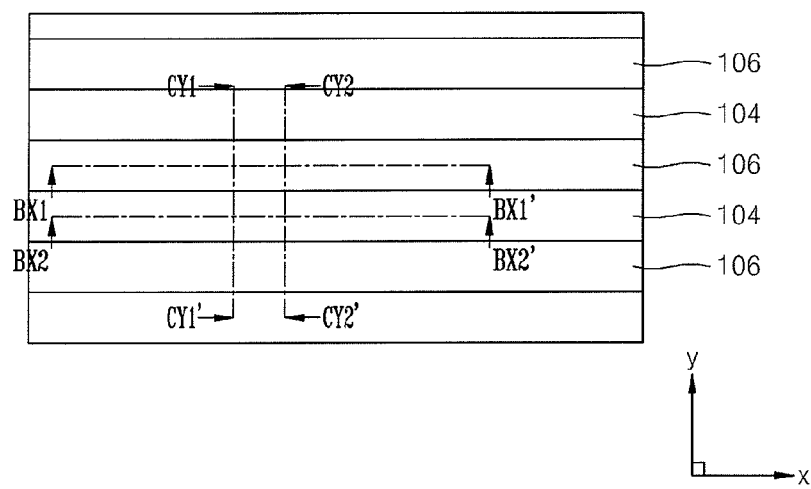
FIGS. 3A through 13C are schematic diagrams sequentially illustrating a method of manufacturing the semiconductor device of FIG. 2A, according to an exemplary embodiment of the inventive concept.
Figure 3B:
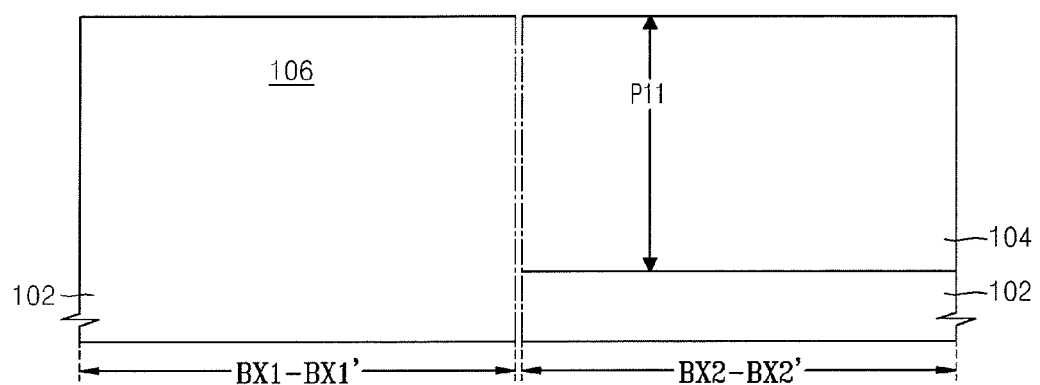
Figure 3C:
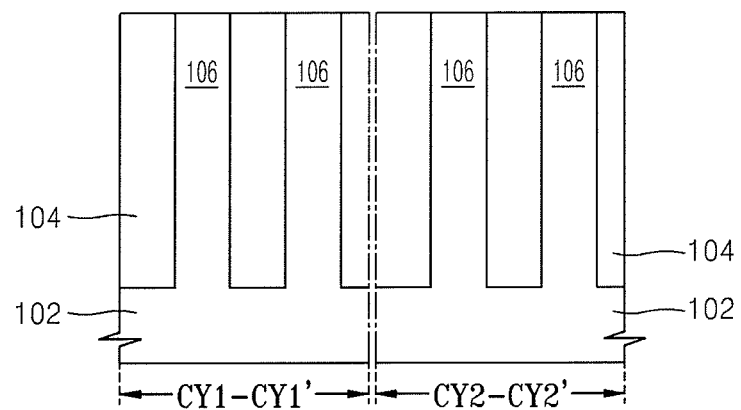

Referring to FIGS. 3A, 3B, and 3C, a plurality of active areas 106 extended in parallel to each other in a first direction (x-direction in FIG. 3A) may be defined on the substrate 102, wherein the plurality of active areas 106 have a line form. Here, the substrate 102 may be a semiconductor substrate and may include, for example, silicon, a silicon-on-insulator, a silicon-on-sapphire, germanium, silicon-germanium, or gallium-arsenide.

For example, the substrate 102 is patterned into a line end space form, an insulation material is deposited on the substrate 102 so as to completely fill the space, and the deposited insulation material is planarized. Then, device isolation layers 104 for filling the space may be formed. For example, the deposited insulation material may be planarized by chemical mechanical polishing (CMP). Here, the device isolation layers 104 may have a bottom having a first depth P11 from the upper surface of the substrate 102. Accordingly, the plurality of active areas 106 extended in parallel to each other in the first direction may be defined by the device isolation layers 104.

Figure 4A:
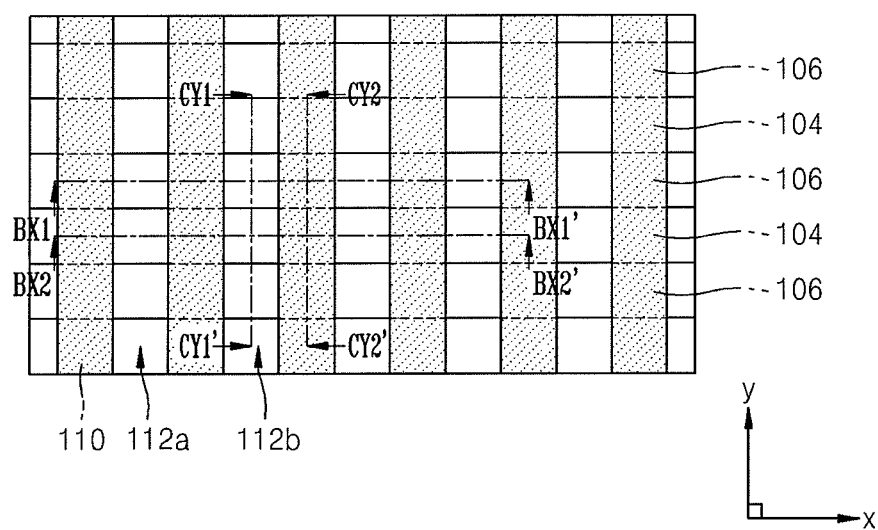
Figure 4B:
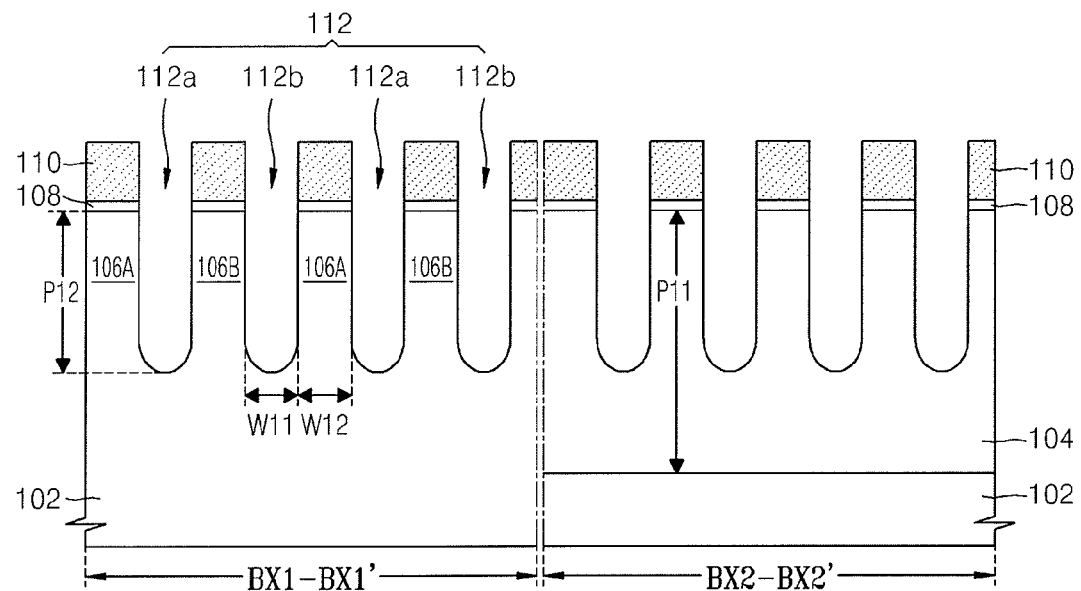
Figure 4C:
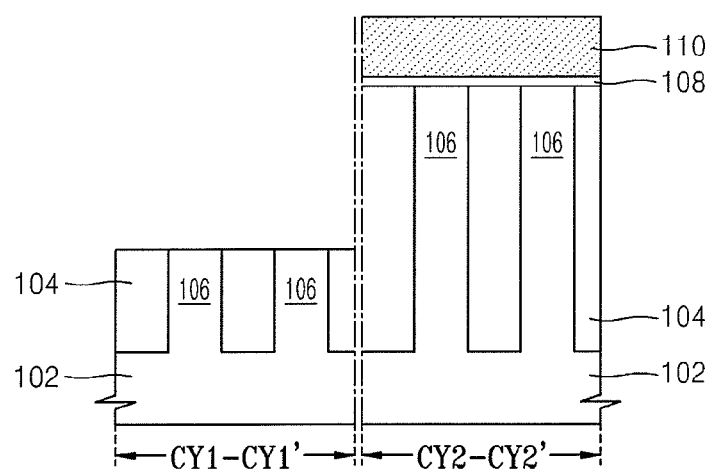

Referring to FIGS. 4A, 4B, and 4C, pad oxide film patterns 108 and first mask patterns 110 each extended in parallel to each other in a second direction (y-direction in FIG. 4A) that is perpendicular or substantially perpendicular to the first direction may be formed on the device isolation layers 104 and the active areas 106. In the current embodiment of the inventive concept, the first mask patterns 110 may each have, for example, a multi-layered structure including a silicon nitride film or a carbon-containing film.

Then, the first mask patterns 110 are used as etching masks so as to etch the exposed device isolation layers 104 and active areas 106 by a predetermined depth, and a plurality of main trenches 112 having bottoms having a second depth P12 from the upper surface of the substrate 102 may be formed. The plurality of main trenches 112 may provide spaces for a plurality of buried bit lines 128 (See, e.g., FIGS. 11A-11C) and thus may be referred to as buried bit line trenches.

The plurality of main trenches 112 may include first main trenches 112a and second main trenches 112b, and the first and second main trenches 112a and 112b may be alternately arranged in the first direction as an extending direction of the active areas 106. Here, the first and second main trenches 112a and 112b may be extended in parallel to each other in a second direction (y-direction in FIG. 4A). Here, the second depth P12 may be less than the first depth P11 of the device isolation layers 104 and may be, for example, about 3000 Å.

For example, the first and second main trenches 112a and 112b are formed such that the active areas 106 may be divided into a plurality of active pillars 106A and 106B. A unit memory cell may be realized in each of the plurality of active pillars 106A and 106B and a vertical channel area to form the unit memory cell may be provided to each of the plurality of active pillars 106A and 106B.

The first and second main trenches 112a and 112b may have equal intervals therebetween along the first direction as an extending direction of the active areas 106 on the substrate 102. First widths W11 of the first and second main trenches 112a and 112b in the first direction may be, for example, larger than second widths W12 of the plurality of active pillars 106A and 106B, and may be, for example, about 30 nm.

Figure 5A:
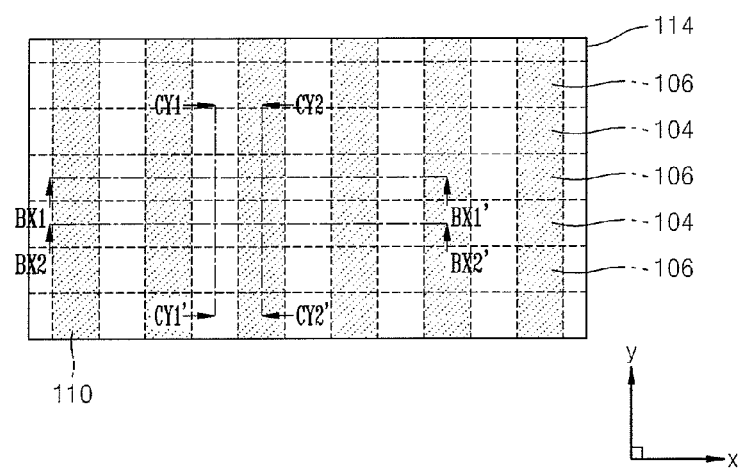
Figure 5B:
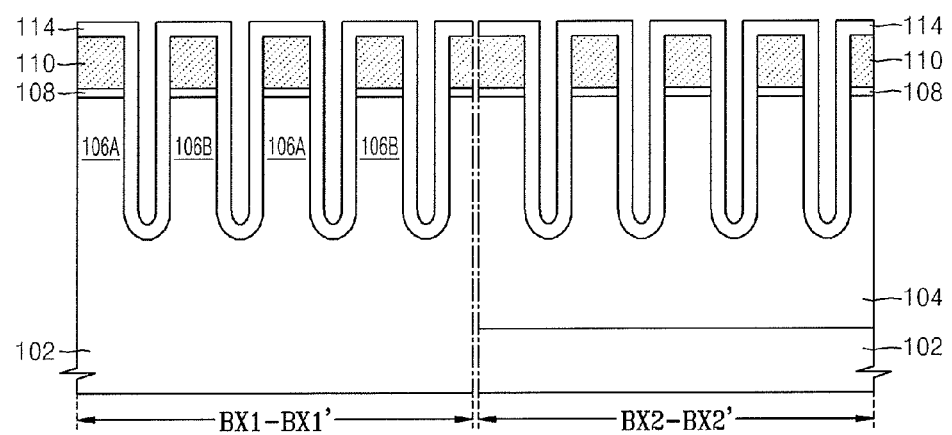
Figure 5C:
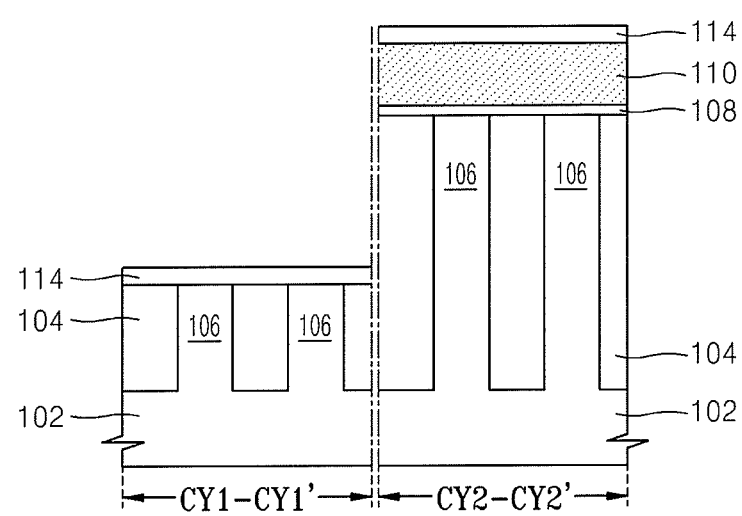

Referring to FIGS. 5A, 5B, and 5C, an insulation material is deposited on the entire surface of the substrate 102 in which the first and second main trenches 112a and 112b are formed so that a first insulation layer 114 may be formed in the first and second main trenches 112a and 112b. In the current embodiment, the first insulation layer 114 may include, for example, an oxide film and may be formed by a deposition process, such as, for example, atomic layer deposition (ALD), chemical vapor deposition (CVD), or physical vapor deposition (PVD). For example, the first insulation layer 114 may have a thickness of about 80 Å.

As the first insulation layer 114 is formed in the first and second main trenches 112a and 112b, the active pillars 106A and 106B may be protected in an etching process, which will be described with reference to FIGS. 6A, 6B, and 6C. Also, widths of a plurality of sub-trenches 116 may be less than the widths of the first and second main trenches 112a and 112b in the forming of the plurality of sub-trenches 116, which will be described with reference to FIGS. 6A, 6B, and 6C.

Figure 6A:
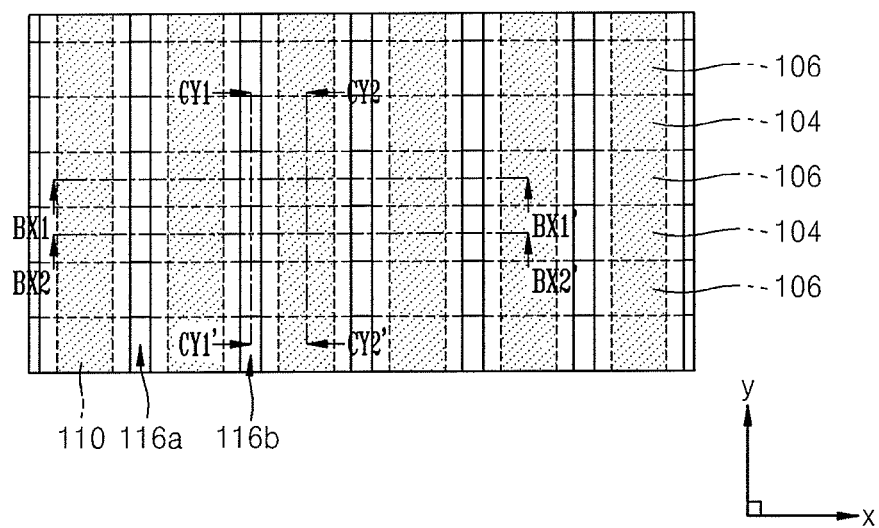
Figure 6B:
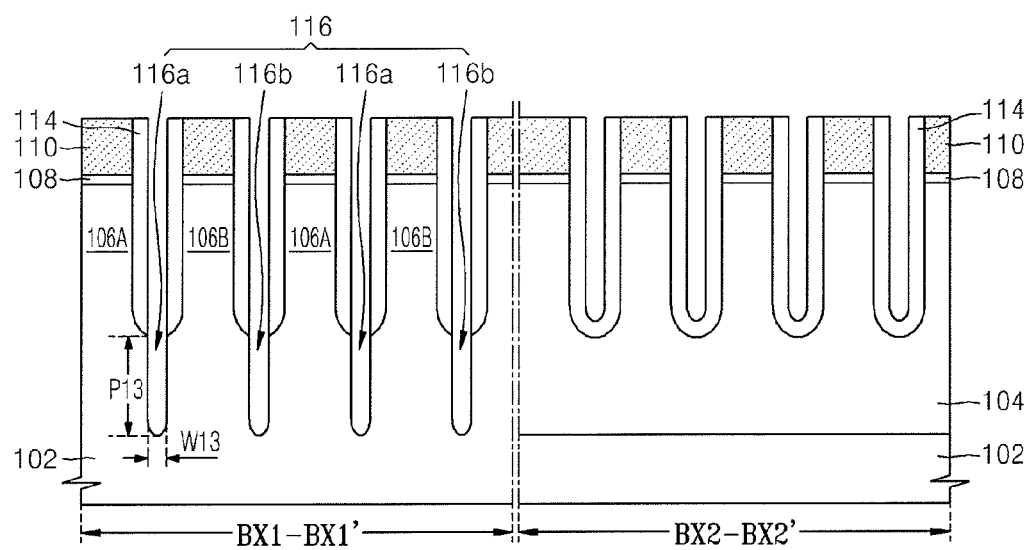
Figure 6C:
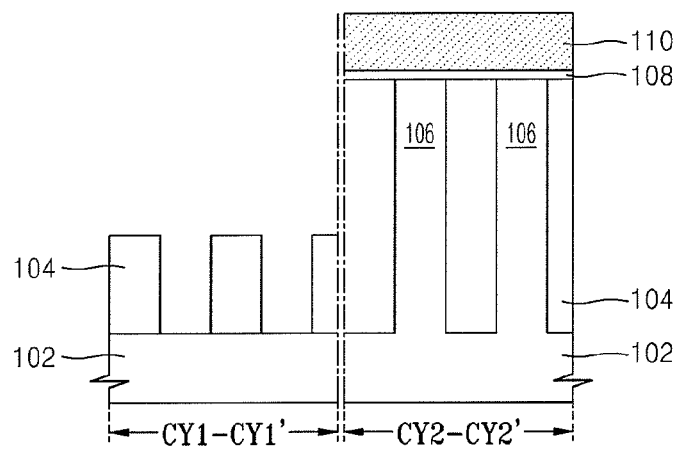

Referring to FIGS. 6A, 6B, and 6C, the first insulation layer 114 may be removed by a predetermined thickness. In the current embodiment of the inventive concept, the first insulation layer 114 may be removed by a predetermined thickness by, for example, dry etching. For example, the predetermined thickness removed may be about 80 Å. Accordingly, the first insulation layers 114 exposed at the bottoms of the first and second main trenches 112a and 112b and the first insulation layers 114 formed on the first mask patterns 110 may be removed.

Then, the first insulation layers 114 remaining on side walls of the first and second main trenches 112a and 112b are used as etching masks so as to over-etch the substrate 102 so that the plurality of sub-trenches 116 having bottoms each having a third depth P13 from the upper surfaces of the first and second main trenches 112a and 112b may be formed. The plurality of sub-trenches 116 may provide spaces for insulating the adjacent active areas from each other and thus may be referred to as trenches for device isolation.

The plurality of sub-trenches 116 may include, for example, first sub-trenches 116a and second sub-trenches 116b, and the first and second sub-trenches 116a and 116B may be alternately arranged along the first direction as an extending direction of the active areas 106. The first sub-trenches 116a may be each connected to the first main trenches 112a and the second sub-trenches 116b may be each connected to the second main trenches 112b.

Referring to FIGS. 4B and 6B, the third depth P13 of the first and second sub-trenches 116a and 116B may be less than the second depth P12 of the first and second main trenches 112a and 112b and may be, for example, about 1300 Å. The sum of the second depth P12 and the third depth P13 may correspond, for example, to the first depth P11 of the device isolation layers 104. Also, third widths W13 of the first and second sub-trenches 116a and 116B may be, for example, smaller than the first widths W11 of the first and second main trenches 112a and 112b and may be, for example, about 12 nm.

Figure 7A:
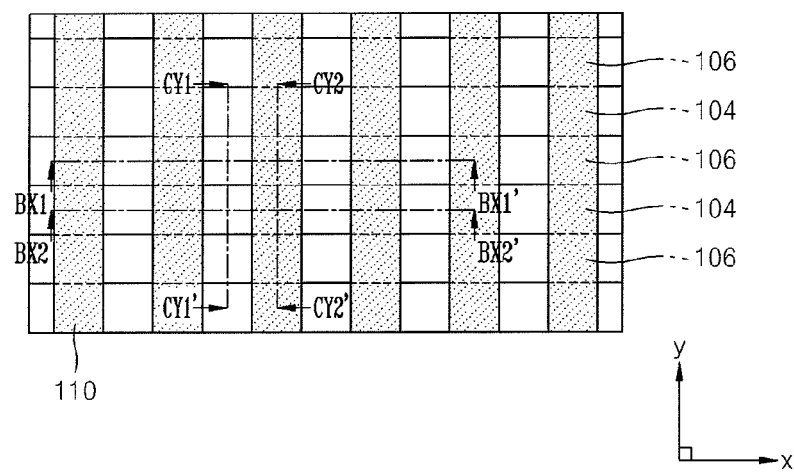
Figure 7B:
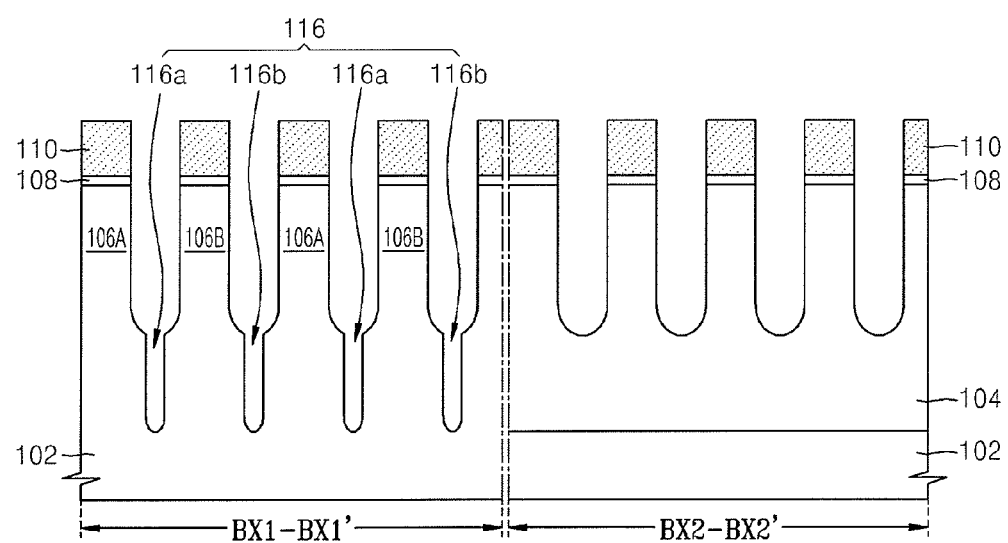
Figure 7C:
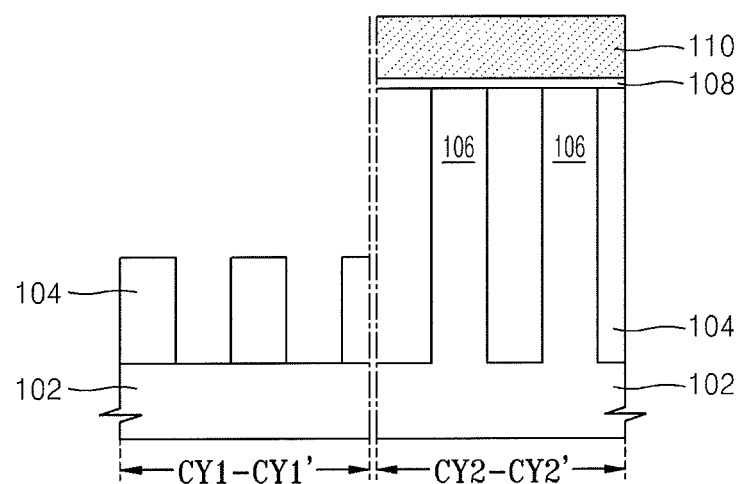

Referring to FIGS. 7A, 7B, and 7C, the first insulation layer 114 remaining on the substrate 102 in which the first and second sub-trenches 116a and 116B are formed may be removed. For example, the first insulation layers 114 remaining on the side walls of the first and second main trenches 112a and 112b may be removed. In the current embodiment of the inventive concept, the first insulation layers 114 may be removed by, for example, using wet cleaning.

Figure 8A:
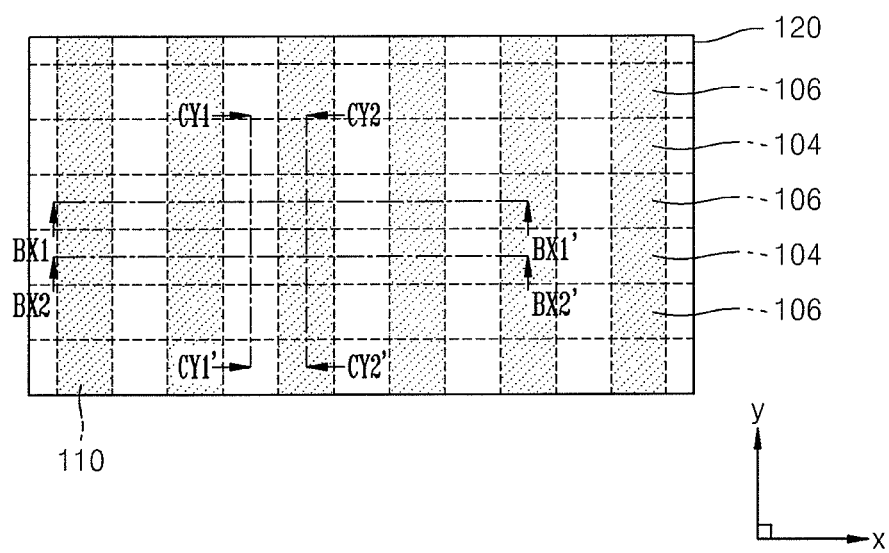
Figure 8B:
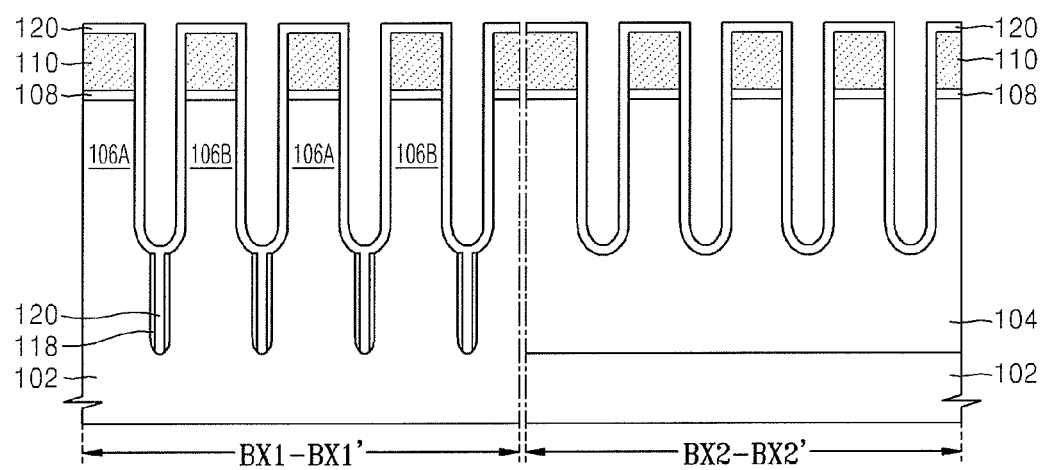
Figure 8C:
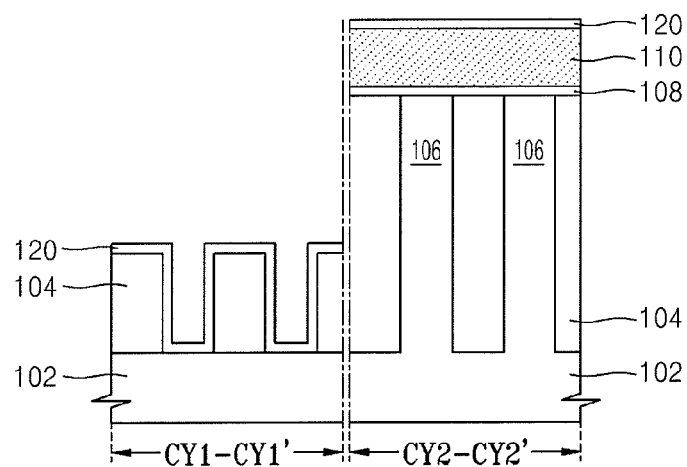

Referring to FIGS. 8A, 8B, and 8C, side wall insulation layers 118 may be formed on inner walls of the first and second sub-trenches 116a and 116B. The side wall insulation layers 118 may facilitate the forming of a second insulation layer 120. In the current embodiment of the inventive concept, the side wall insulation layers 118 may each include, for example, an oxide layer and may be formed by radical oxidization. For example, the side wall insulation layers 118 may each have a thickness of about 30 Å.

For example, an insulation layer to cover the entire upper surface of the substrate 102, in which the first and second sub-trenches 116a and 116B are formed, is formed by radical oxidization and then the formed insulation layer is etched back so that the side wall insulation layers 118 remain only on the inner walls of the first and second sub-trenches 116a and 116B.

Then, the second insulation layer 120 for completely filling the first and second sub-trenches 116a and 116B may be formed. The second insulation layer 120 may be referred to as a buried insulation layer. In the current embodiment of the inventive concept, the second insulation layer 120 may include a silicon nitride, for example, and may be formed by a deposition process, such as, for example, ALD, CVD, or PVD. For example, the second insulation layer 120 may have a thickness of about 50 Å.

For example, the second insulation layer 120 is deposited to cover the upper surface of the substrate 102 in which the side wall insulation layers 118 are formed so that the second insulation layer 120 may completely fill the first and second sub-trenches 116a and 116B. Hence, forming of the second insulation layer 120, which completely fills the first and second sub-trenches 116a and 116B, may be referred to as a gap-fill process.

Figure 9A:
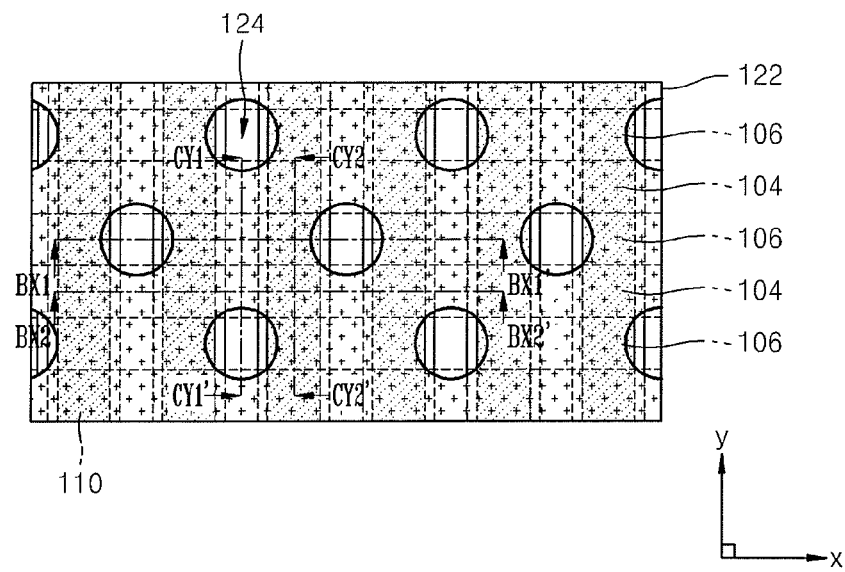
Figure 9B:
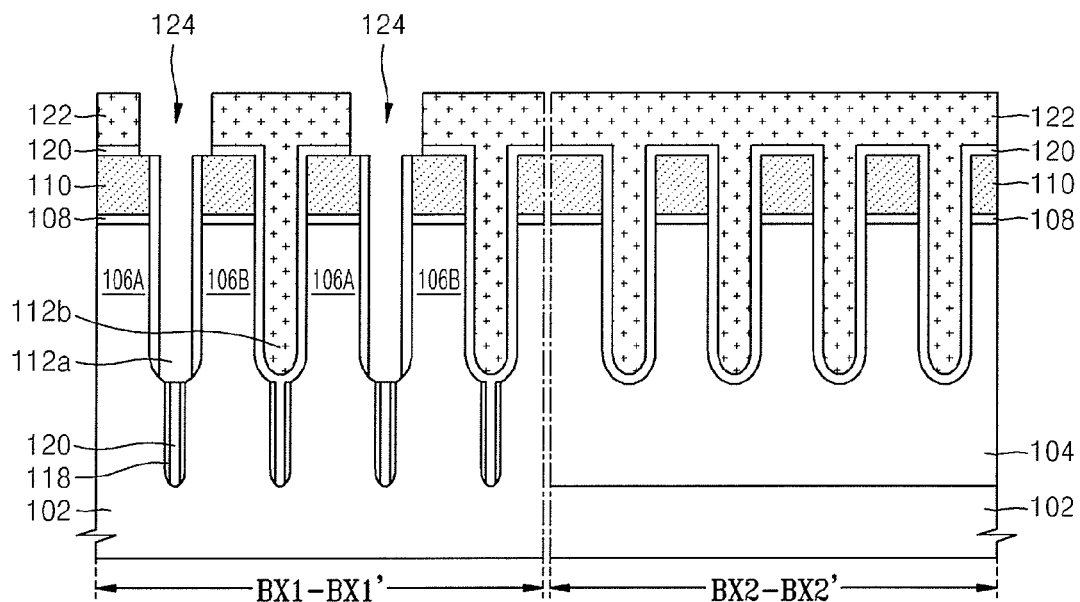
Figure 9C:
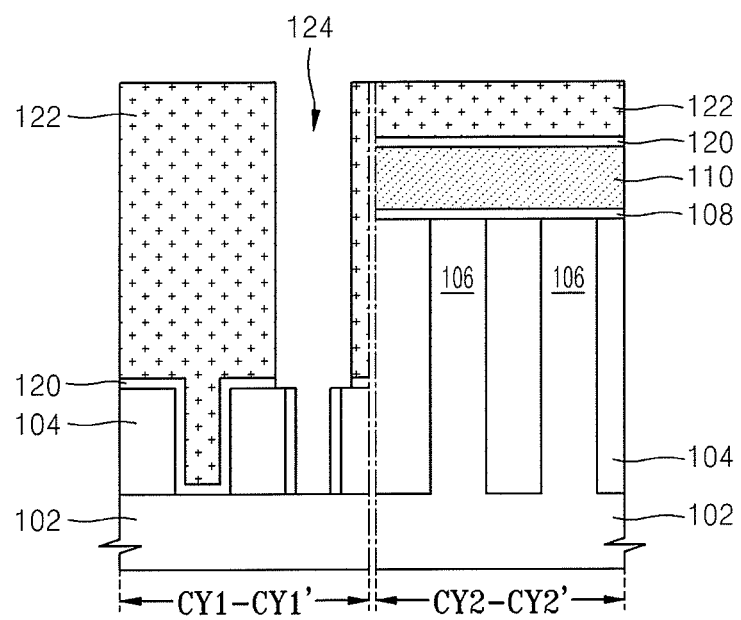

Referring to FIGS. 9A, 9B, and 9C, second mask patterns 122 may be formed on the substrate 102, on which the second insulation layer 120 is formed. In the current embodiment of the inventive concept, the second mask patterns 122 may be formed of a material that may provide etch selectivity with respect to the second insulation layer 120 and may be formed by photolithography. For example, the second mask patterns 122 may include an amorphous carbon layer (ACL), or a layer (hereinafter, referred to as a spin-on hardmask (SOH) layer) including a hydrocarbon compound or a derivative thereof, and the hydrocarbon compound has relatively high carbon content of about 85 to about 99 weight % based on the total weight thereof.

An antireflection film (not illustrated) may be further formed on the second mask patterns 122. In the current embodiment of the inventive concept, the antireflection film may include, for example, silicon oxynitride (SiON) and may be formed by a deposition process, such as, for example, CVD or PVD. For example, the antireflection film may have a thickness of about 300 Å.

For example, a mask layer that fills the inside of the first and second main trenches 112a and 112b and covers the second insulation layer 120 is formed, the formed mask layer is patterned, and thereby the second mask patterns 122 having a plurality of openings 124 that expose the second insulation layer 120 at some lower surfaces of the first and second main trenches 112a and 112b may be formed.

In the current embodiment of the inventive concept, the second mask patterns 122 may partially expose areas where a first active area 106 of one of the plurality of active areas 106 crosses with the first main trenches 112a and areas where a second active area 106 disposed adjacent to the first active area 106 from among the plurality of active areas 106 crosses with the second main trenches 112b. For example, the second mask patterns 122 may expose the areas where the active area 106 crosses with the first main trenches 112a. Although not illustrated, the second mask patterns 122 may expose the areas where the other active area 106 that is adjacent to the active area 106 crosses with the second main trenches 112b.

Then, the second insulation layer 120 formed at bottoms of each of the first main trenches 112a may be etched. Here, the second insulation layer 120 on the first mask patterns 110 and the second insulation layer 120 on the device isolation layer 104 each exposed by the second mask patterns 122 may be partially etched.

Figure 10A:
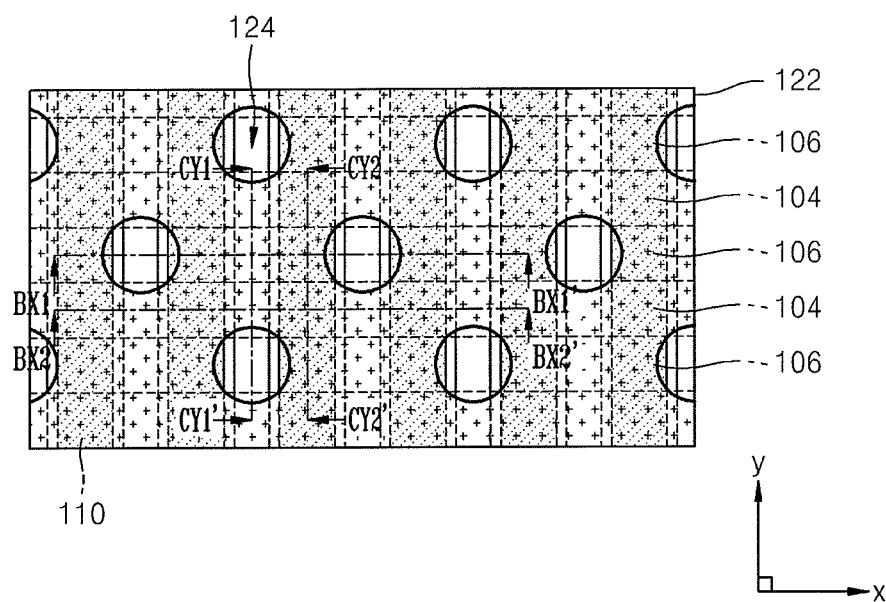
Figure 10B:
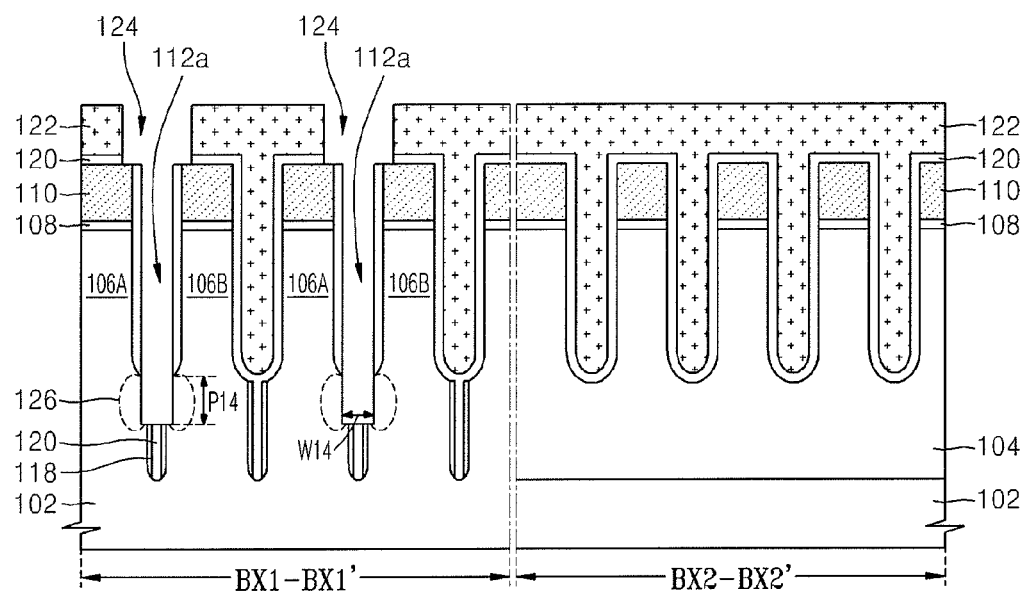
Figure 10C:
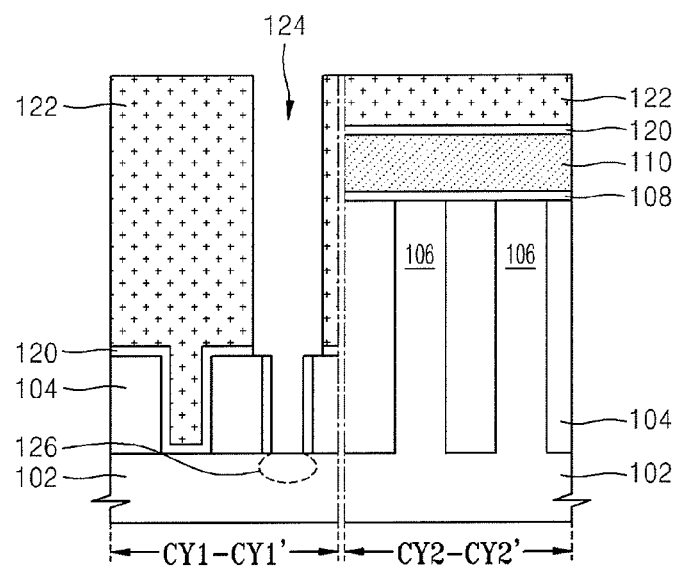

Referring to FIGS. 10A, 10B, and 10C, the second insulation layer 120 exposed through the second mask patterns 122 and the plurality of openings 124 is used as an etching mask so as to etch the second insulation layers 120 and the side wall insulation layers 118 each formed in the first sub-trenches 116a, and some active areas 106 adjacent to the first sub-trenches 116a by a fourth depth P14 and thus, the substrate 102, that is, some of the active areas 106, may be exposed. Here, although the substrate 102 is partially exposed, the second insulation layer 120 disposed in a lower portion of the substrate 102 may remain.

The etching process in the current embodiment of the inventive concept may be, for example, a 2-step etching process including performing etch back of the second insulation layer 120 and the side wall insulation layers 118 and selectively etching the active areas 106. However, exemplary embodiments of the inventive concept are not limited thereto but rather alternatively the etching process may be a single etching process including sequentially etching the second insulation layer 120, the side wall insulation layers 118, and the active areas 106.

Accordingly, the first main trenches 112a may be extended by the fourth depth P14, and the fourth depth P14 may be, for example, about 500 Å. For example, fourth widths W14 of the first main trenches 112a may be larger than the third widths W13 of the first and second sub-trenches 116a and 116B. (See FIGS. 6B and 10B). For example, the fourth width W14 may be about 20 nm and the third width W13 may be about 12 nm.

Then, impurity ions are injected into the active areas 106 through the plurality of openings 124 so that first source/drain areas 126 may be formed in the exposed active areas 106. For example, the impurity ions may include N-type impurity ions. However, exemplary embodiments of the inventive concept are not limited thereto.

In one active area 106 illustrated in FIG. 10B, the active areas 106 are exposed at the bottoms of the first main trenches 112a and thereby, the first source/drain areas 126 may be formed in the exposed active areas 106. Although not illustrated, in the other active area 106 that is adjacent to the active area 106, the active areas 106 are exposed at the bottoms of the second main trenches 112b and thereby, the first source/drain areas 126 may be formed in the exposed active areas 106.

Figure 11A:
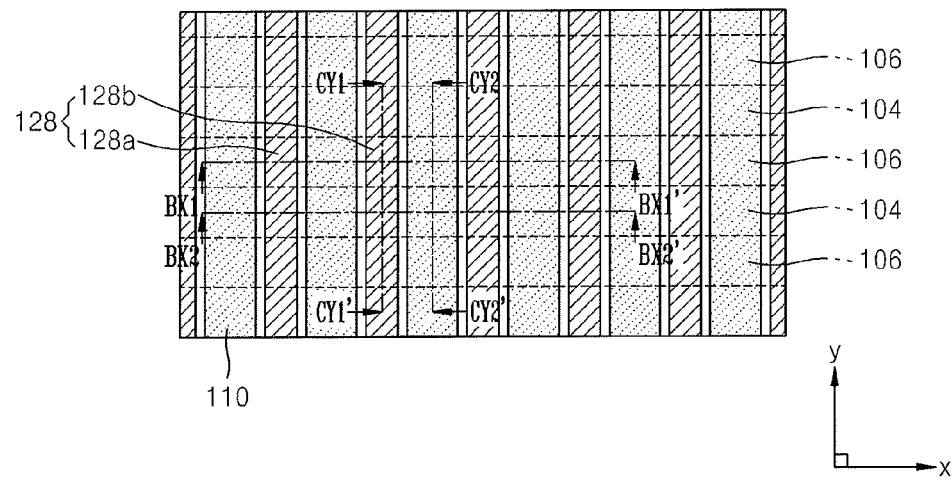
Figure 11B:
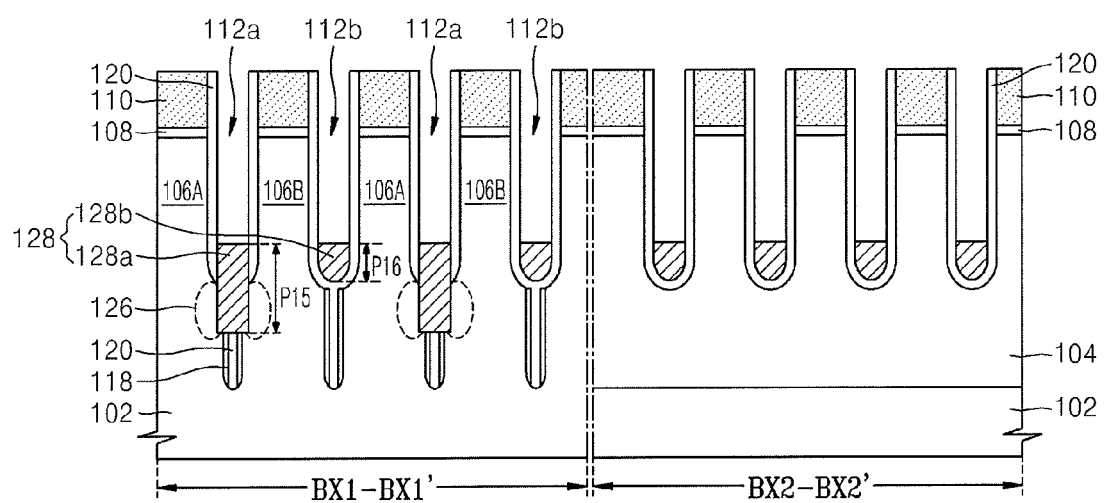
Figure 11C:
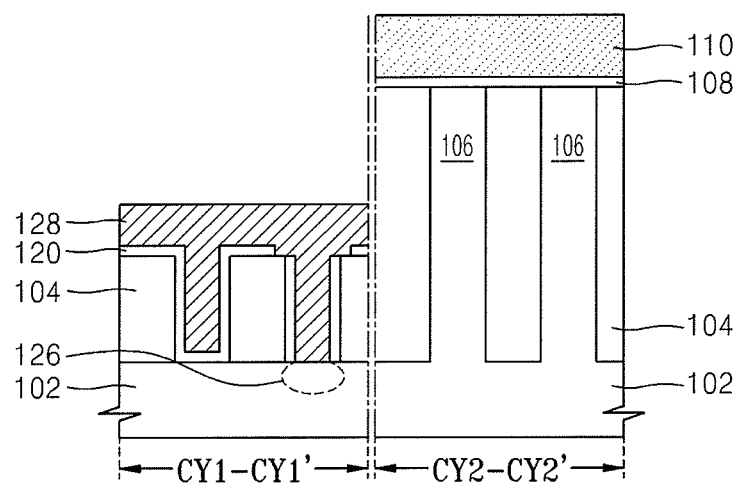

Referring to FIGS. 11A, 11B, and 11C, the substrate 102, in which the first source/drain areas 126 are formed, is cleaned and then, a barrier layer (not illustrated) may be formed on the substrate 102. In the cleaning process, the second mask patterns 122 may be removed. In the current embodiment of the inventive concept, the barrier layer may include, for example, titanium (Ti), titanium nitride (TiN), or the like and may be formed by, for example, a deposition process.

Then, a plurality of bit lines 128 which includes first and second buried bit lines 128a and 128b may be formed on the second insulation layer 120, that is, in the extended first main trenches 112a and second main trenches 112b. In the current embodiment of the inventive concept, the first and second buried bit lines 128a and 128b may each include a metal material, such as, for example, tungsten (W), tantalum (Ta), or the like, a nitride thereof, silicide thereof, or doped polysilicon, and may be formed by, for example, a deposition process. For example, fifth depths P15 of the first buried bit lines 128a formed in the extended first main trenches 112a may be about 1000 Å, and sixth depths P16 of the second buried bit lines 128b formed in the extended second main trenches 112b may be about 500 Å.

For example, a conductive material is deposited on a resultant, on which the barrier layer is formed, and a conductive layer (not illustrated) that fills the inside of the extended first main trenches 112a and second main trenches 112b may be formed on the second insulation layer 120. Then, the conductive layer is partially removed by etch back so as to remain on the extended first main trenches 112a and second main trenches 112b so that the first and second buried bit lines 128a and 128b having the fifth depth P15 and the sixth depth P16, respectively, may be formed.

In one active area 106 illustrated in FIG. 11B, the fifth depths P15 of the first buried bit lines 128a may be, for example, larger than the sixth depths P16 of the second buried bit lines 128b. Although not illustrated, in the other active area 106 that is adjacent to the active area 106, the sixth depth P16 of the second buried bit lines 128b may be, for example, larger than the fifth depths P15 of the first buried bit lines 128a.

The first and second buried bit lines 128a and 128b may each be extended in a second direction by crossing between two adjacent active pillars 106A and 106B. Two unit memory cells each realized in the two active pillars 106A and 106B may share the first source/drain areas 126 disposed around the bottoms of the first buried bit lines 128a with the first buried bit lines 128a interposed between the two active pillars 106A and 106B. Accordingly, two adjacent active pillars 106A and 106B may constitute a single active area.

In one active area 106 illustrated in FIG. 11B, the second insulation layers 120 formed in the second sub-trenches 116b that are disposed below the second buried bit lines 128b interposed between two adjacent single active areas may insulate the two adjacent single active areas from each other and thus may correspond to field areas. Although not illustrated, in the other active area 106 that is adjacent to the active area 106, the second insulation layers 120 formed in the first sub-trenches 116a that are disposed below the first buried bit lines 128a interposed between two adjacent single active areas may insulate the two adjacent single active areas from each other and thus may correspond to field areas.

Then, a planarization process is performed so that the second insulation layers 120 formed on the substrate 102 may be removed.

Figure 12A:
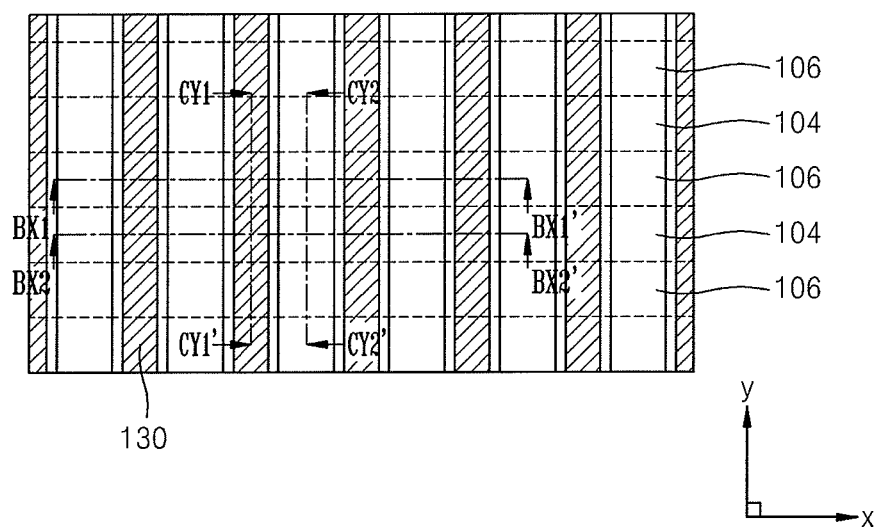
Figure 12B:
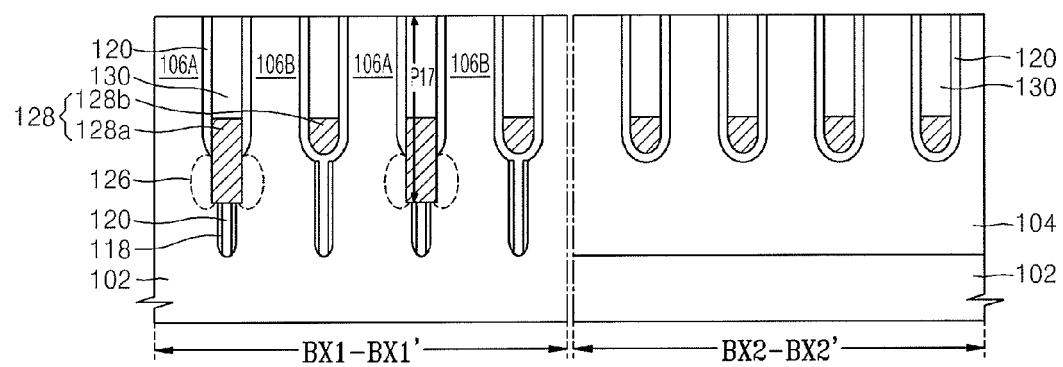
Figure 12C:
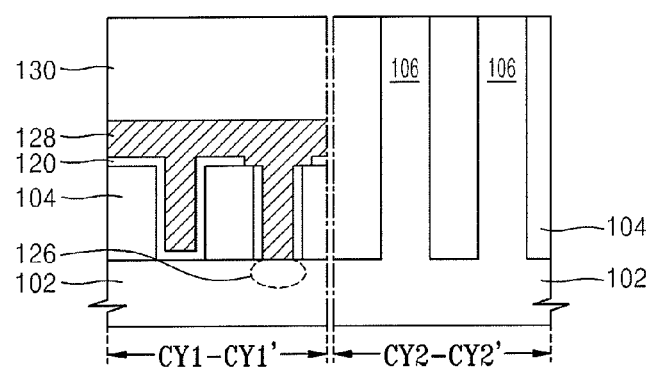

Referring to FIGS. 12A, 12B, and 12C, a third insulation layer 130 that fills the extended first main trenches 112a and second main trenches 112b may be formed. In the current embodiment of the inventive concept, the third insulation layer 130 may include, for example, a silicon nitride and may be formed by a deposition process, such as, for example, ALD, CVD, or PVD.

Then, a planarization process is performed so that the pad oxide film patterns 108 and the first mask patterns 110 each formed on the substrate 102 may be removed. Accordingly, a seventh depth P17 from the upper surface of the substrate 102 to the bottoms of the first buried bit lines 128a may be, for example, about 3500 Å.

Figure 13A:
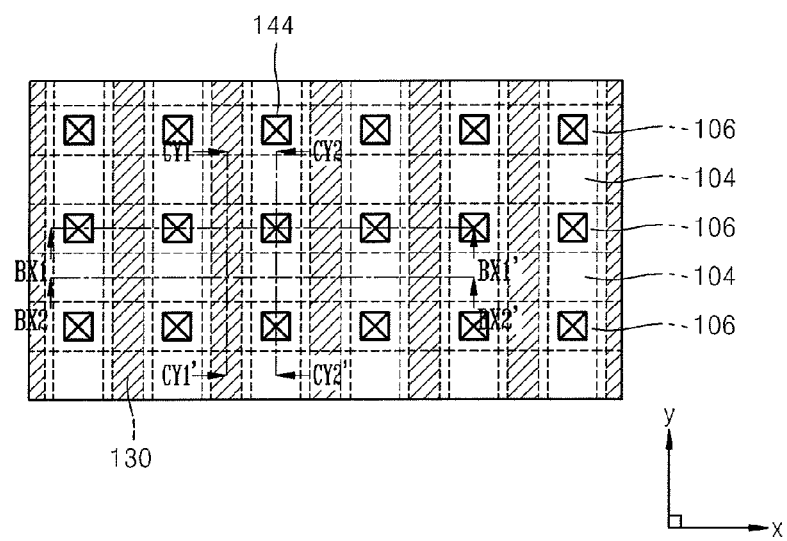
Figure 13B:
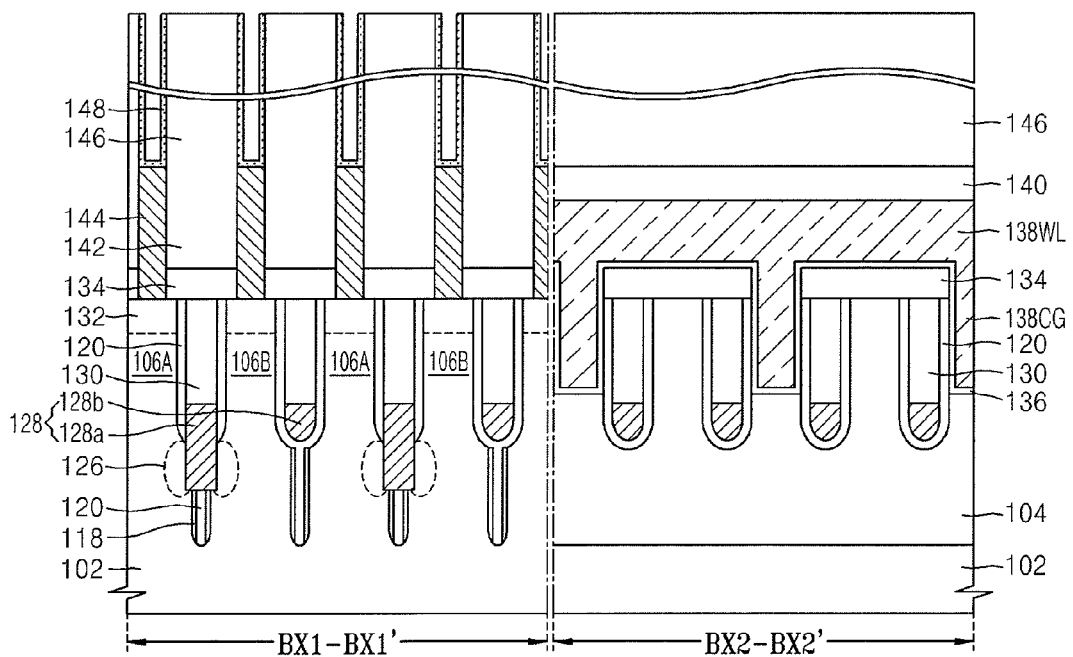
Figure 13C:
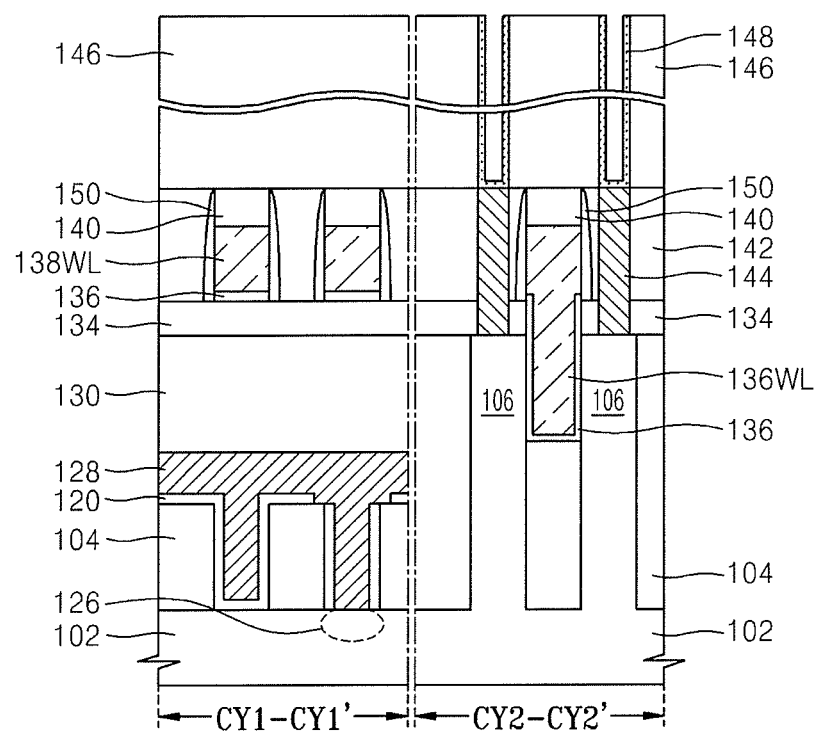

Referring to FIGS. 13A, 13B, and 13C, second source/drains areas 132 may be formed by injecting impurity ion on the active pillars 106A and 106B. The impurity ions may be, for example, the same conductive impurity ions as in the first source/drain areas 126. For example, the impurity ions may include N-type impurity ions. However, exemplary embodiments of the inventive concept are not limited thereto.

Then, contact gates 138CG and word lines 138WL may be formed. For example, an oxide film pattern 134 is formed on a resultant, to which the second source/drains areas 132 are to be formed, and then contact gate recesses (not illustrated) may be formed in areas where the contact gates 138CG of FIG. 1 are to be formed. Then, an insulation material for forming a gate insulation layer 136 in the inner wall of the contact gate recesses and a conductive layer (not illustrated) for filling the inner space of the contact gate recesses and covering the upper surface of the substrate 102 may be formed. Then, a capping insulation layer pattern 140 is formed and then the plurality of word lines 138WL extended in parallel to each other may be formed.

The contact gate 138CG may be interposed between two adjacent active areas along a direction between the x-direction and the y-direction in FIG. 1, for example, the oblique line direction DL of FIG. 1. A unit memory cell including one active pillar included in any one active area from two adjacent active areas may share one contact gate 138CG with a unit memory cell including one active pillar included in the other active area.

Then, buried contact plugs 144 may be formed. For example, insulation spacers 150 may be formed at both side walls of the word lines 138WL and the capping insulation layer pattern 140, and the insulation spacers 150 may include a silicon nitride film. Then, planarized insulation layers 142 are formed on the substrate 102, on which the insulation spacers 150 are formed, and the planarized insulation layers 142 and the capping insulation layer pattern 140 are etched so as to expose the oxide film pattern 134, and the exposed oxide film pattern 134 is etched, thereby forming a plurality of buried contact holes (not illustrated). Then, a conductive layer that completely fills the inside of the plurality of buried contact holes is formed, the conductive layer is planarized until the upper surface of the planarized insulation layers 142 is exposed, and the plurality of buried contact plugs 144 may be formed in the plurality of buried contact holes.

Then, capacitor lower electrodes 148 may be formed. For example, sacrificial insulation layer patterns 146, in which a plurality of storage node holes (not illustrated) are formed, are formed and then, the capacitor lower electrodes 148 each connected to the plurality of buried contact plugs 144 may be formed in the plurality of storage node holes. Although not illustrated, the sacrificial insulation layer patterns 146 may be removed, and dielectric layers and upper electrodes may be each formed on the plurality of capacitor lower electrodes 148, thereby forming a plurality of capacitors.

As described above, according to a method of manufacturing the semiconductor device 100 according to the current embodiment of the inventive concept, the active areas 106 are formed in the line form so that although misaligning may occur while performing a photolithography process for forming the second mask patterns 122, widths of the plurality of active pillars 106A and 106B may each be uniform. For example, the main trenches 112 and the sub-trenches 116 are formed after the active areas 106 are formed in the line form so that width dispersion of the active pillars due to misaligning may be reduced.

In this regard, a change in a width of contact gates is reduced so as to reduce deviation of electric characteristics in a plurality of unit memory cells. Also, the plurality of buried bit lines 128 are self-aligned in the main trenches 112 and the sub-trenches 116 and thus a short between the buried bit lines 128 and the adjacent active areas 106 may be prevented from occurring.

Figure 14:
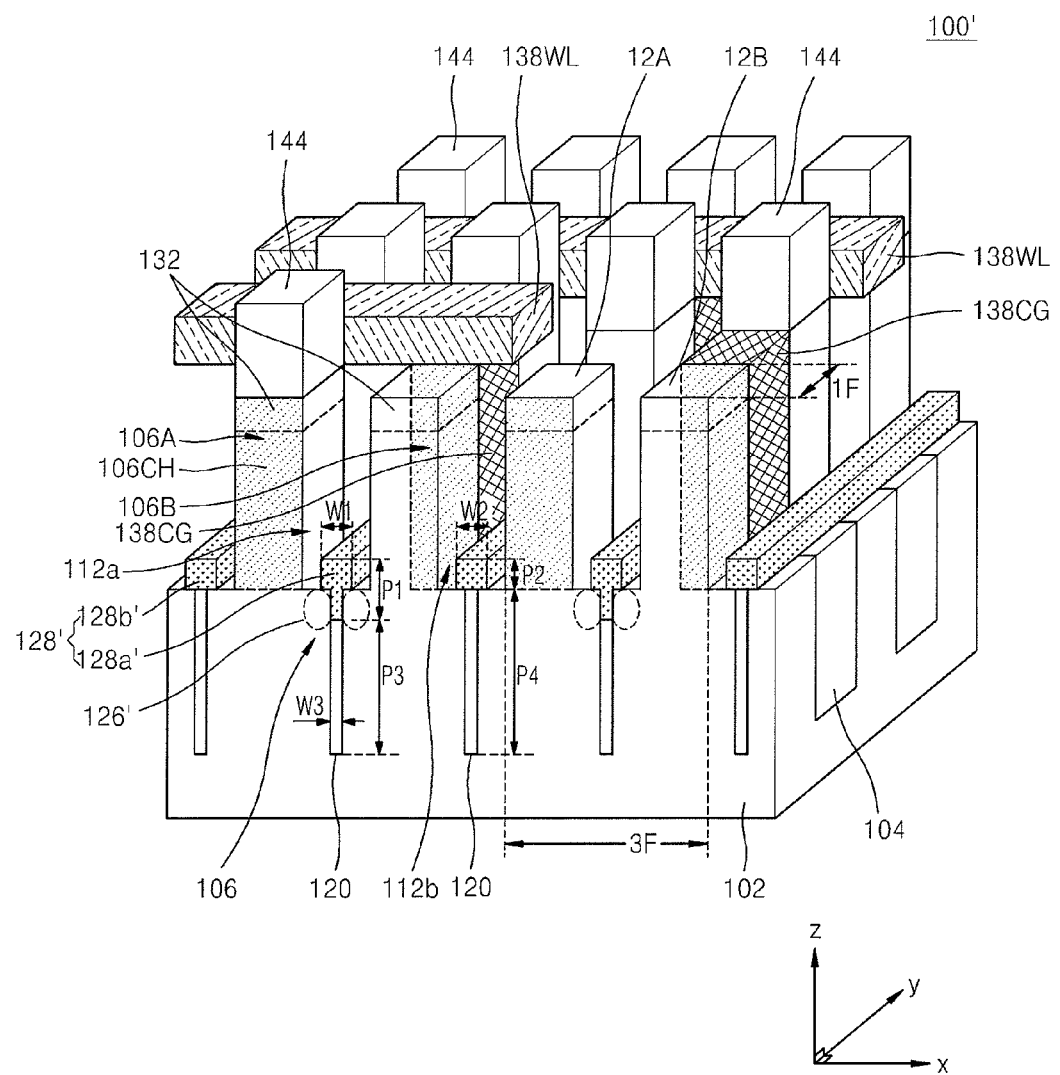
FIG. 14 is a partial perspective view illustrating the three-dimensional arrangement relationship between elements forming a cell array area in a semiconductor device according to an exemplary embodiment of the inventive concept.

FIG. 14 is a partial perspective view illustrating the three-dimensional arrangement relationship between elements forming a cell array area in a semiconductor device 100' according to an embodiment of the inventive concept.

Referring to FIG. 14, the semiconductor device 100' according to the current embodiment of the inventive concept is a modification of the semiconductor device 100 of FIG. 2A. Accordingly, detailed description about the same elements will be omitted and only differences will be described.

In the current embodiment of the inventive concept, a plurality of buried bit lines 128' may each include first and second buried bit lines 128a' and 128b', and depths from upper surfaces to lower surfaces of the first and second buried bit lines 128a' and 128b' may be different from each other according to positions thereof.

For example, a first depth P1 of the first buried bit line 128a' may be larger than a second depth P2 of the second buried bit line 128b' in one active area 106. For example, the first depth P1 may be double the second depth P2. Also, the first depth P1 may, for example, be smaller than the second depth P2 in the other active area 106 adjacent to the one active area 106.

The first buried bit lines 128a' each have a first width W1 in the first main trench 112a, whereas the first buried bit lines 128a' each have a third width W3 in the substrate 102. The second buried bit lines 128b' may each have a uniform second width W2. Here, for example, the first width W1 may be larger than the third width W3 and may be substantially the same as the second width W2.

The plurality of buried insulation layers 120 may be disposed at bottoms of the first and second buried bit lines 20A' and 20B'. The plurality of buried insulation layers 120 may include the first buried insulation layers 120 disposed at the bottom of the first buried bit lines 128a' and the second buried insulation layers 120 disposed at the bottom of the second buried bit lines 128b', and depths from the upper surfaces to the lower surfaces of the first 120 and second 120 buried insulation layers may be different from each other according to positions thereof.

For example, a third depth P3 of the first buried insulation layer 120 may be smaller than a fourth depth P4 of the second buried insulation layer 120 in one active area 106. Also, the third depth P3 may be, for example, larger than the fourth depth P4 in the other active area 106 adjacent to the one active area 106.

Here, an area where the active area 106 crosses with the first buried bit line 128a' and an area where the other active area 106 crosses with the second buried bit line 128b' may correspond to contact areas. Also, an area where the active area 106 crosses with the second buried insulation layer 120 and an area where the other active area 106 crosses with the first buried insulation layer 120 may correspond to field areas. Accordingly, the active areas 106 disposed at both sides of the field area may be insulated from each other.

According to the current embodiment of the inventive concept, the first 120 and second 120 buried insulation layers may function as the field areas according to the positions thereof so that an additional device isolation layer may not be formed in an extending direction of the active areas 106. Accordingly, a trim photoresist process for the active areas 106 is not required and thus an overall manufacturing process may be simplified.

FIGS. 15A through 18B are schematic diagrams sequentially illustrating a method of manufacturing the semiconductor device 100' of FIG. 14, according to an embodiment of the inventive concept. In particular, FIGS. 15A, 16A, . . . , and 18A are plane views of an area of a rectangle "P" in FIG. 1. FIGS. 15B, 16B, . . . , and 18B are cross-sectional views of the area along lines BX1-BX1' and BX2-BX2' of FIGS. 15A, 16A, . . . , and 18A.

An Embodiment described with reference to FIGS. 15A through 18B is similar to the methods described with reference to FIGS. 3A through 13C. Thus, only differences therebetween will be described below.

Figure 15A:
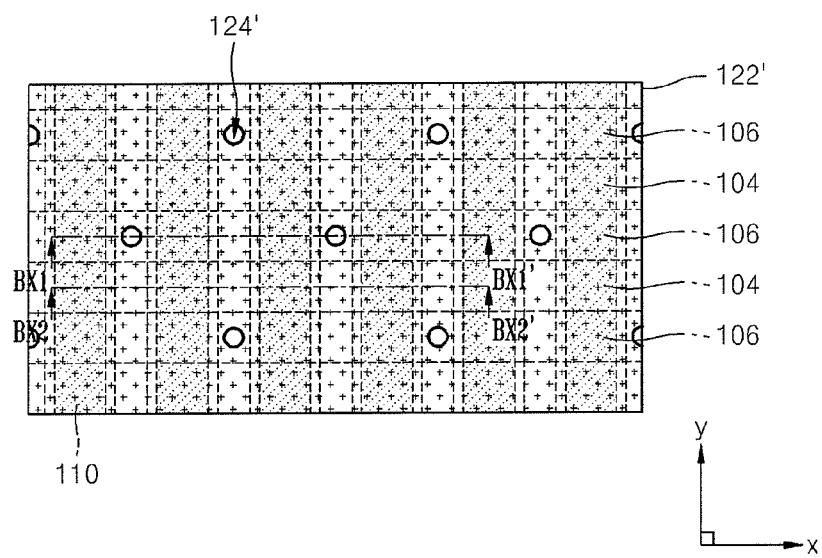
FIGS. 15A through 18B are schematic diagrams sequentially illustrating a method of manufacturing the semiconductor device of FIG. 14, according to an exemplary embodiment of the inventive concept.
Figure 15B:
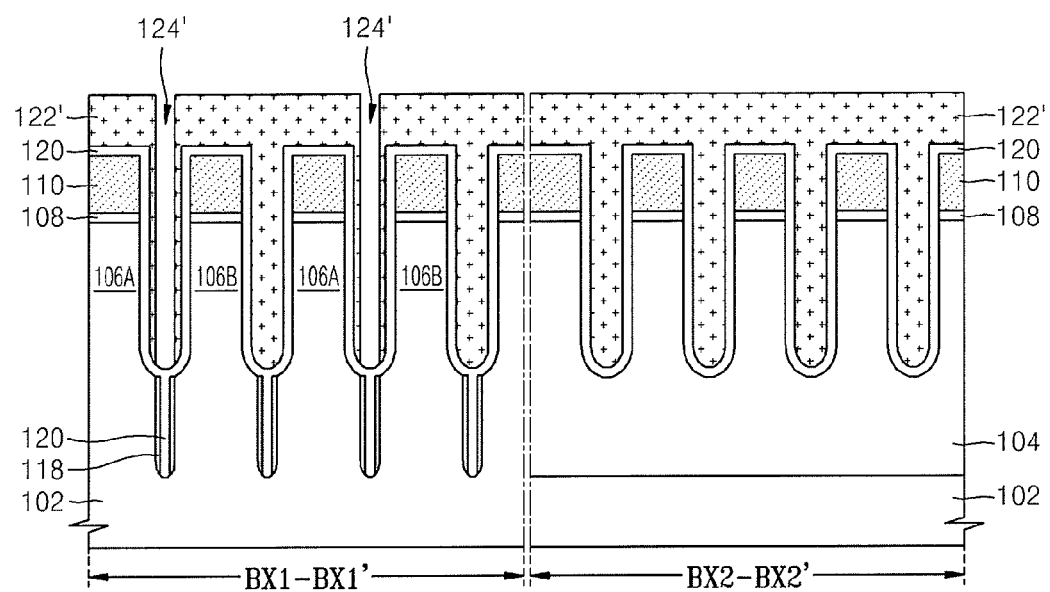

Referring to FIGS. 15A and 15B, the second insulation layer 120 is formed on the substrate 102 according to a series of processes described with reference to FIGS. 3A through 8C.

Then, second mask patterns 122' may be formed on the substrate 102, on which the second insulation layer 120 is formed. For example, a mask layer that fills the inside of the first and second main trenches 112a and 112b and covers the second insulation layer 120 is formed, the formed mask layer is patterned, and thereby the second mask patterns 122' having a plurality of openings 124' that expose the second insulation layer 120 at some lower surfaces of the first and second main trenches 112a and 112b may be formed.

In the current embodiment of the inventive concept, the second mask patterns 122' may partially expose areas where a first active area 106 of one of the plurality of active areas 106 crosses with the first main trenches 112a and areas where a second active area 106 disposed adjacent to the first active area 106 from among the plurality of active areas 106 crosses with the second main trenches 112b. For example, the second mask patterns 122' may partially expose the areas where the active area 106 crosses with the first main trenches 112a in FIG. 15B. Although not illustrated, the second mask patterns 122' may partially expose the areas where the other active area 106 that is adjacent to the active area 106 crosses with the second main trenches 112b.

In the current embodiment of the inventive concept, the width of the plurality of openings 124' may be, for example, smaller than the width of the plurality of openings 124 illustrated in FIGS. 9A and 9B. For example, the width of the plurality of openings 124' may be small so as to not expose the second insulation layer 120 formed at the side walls of the first main trenches 112a.

Figure 16A:
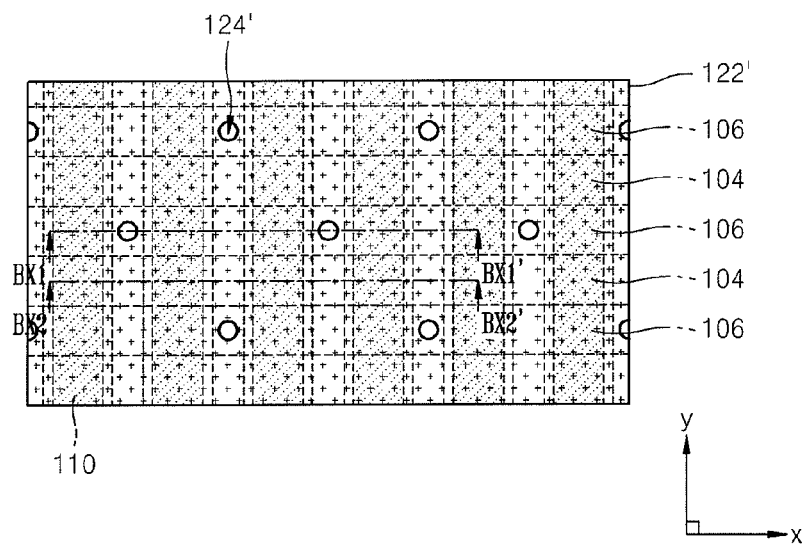
Figure 16B:
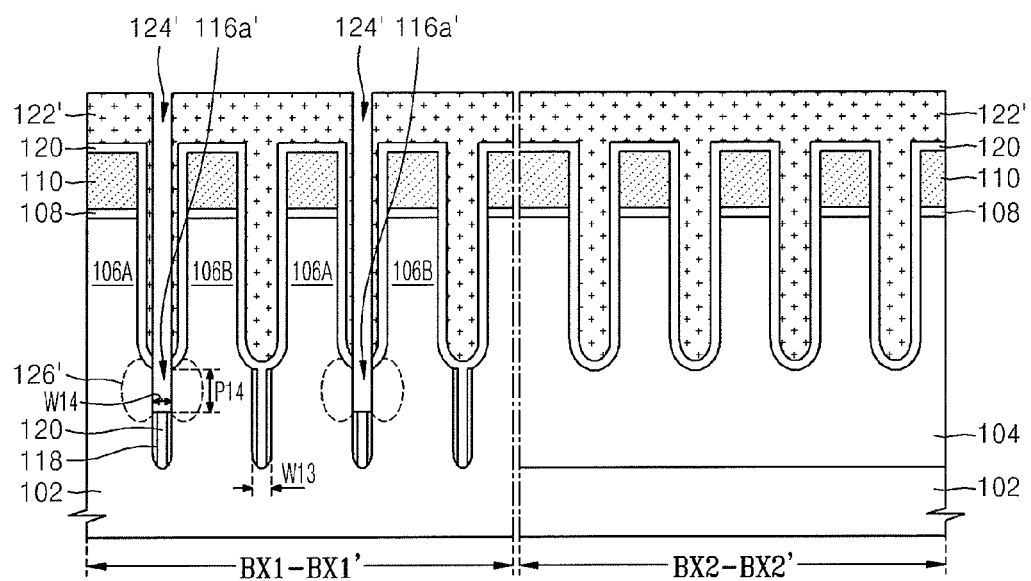

Referring to FIGS. 16A and 16B, the second mask patterns 122' are used as an etching mask so as to partially etch the second insulation layers 120 and the side wall insulation layers 118 each formed in first sub-trenches 116a' by the fourth depth P14 and thus, the substrate 102, that is, some of the active areas 106, may be exposed. Here, although the substrate 102 is partially exposed, the second insulation layer 120 disposed in a lower portion of the substrate 102 may remain.

In this regard, the first main trenches 112a may be extended by the fourth depth P14, and the fourth depth P14 may be, for example, about 500 Å. Here, the fourth widths W14 of the first main trenches 112a may be substantially the same as the third widths W13 of the first and second sub-trenches 116a' and 116B. For example, the fourth widths W14 may be about 12 nm.

Then, impurity ions are injected into the active areas 106 through the plurality of openings 124' so that first source/drain areas 126' may be formed in the exposed active areas 106. For example, the impurity ions may include N-type impurity ions. However, exemplary embodiments of the inventive concept are not limited thereto.

In one active area 106 illustrated in FIG. 16B, the active areas 106 are exposed at the bottoms of the first main trenches 112a and thereby, the first source/drain areas 126' may be formed in the exposed active areas 106. Although not illustrated, in the other active area 106 that is adjacent to the active area 106, the active areas 106 are exposed at the bottoms of the second main trenches 112b and thereby, the first source/drain areas 126' may be formed in the exposed active areas 106.

Figure 17A:
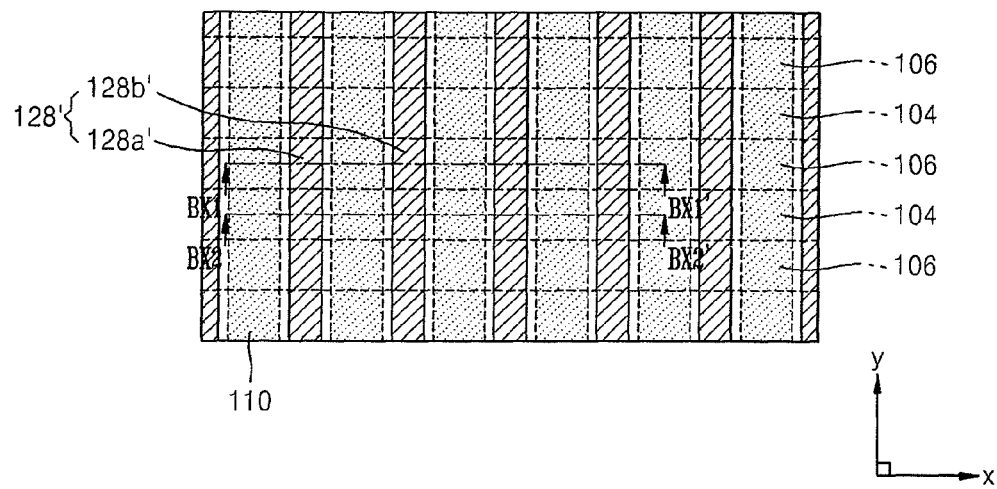
Figure 17B:
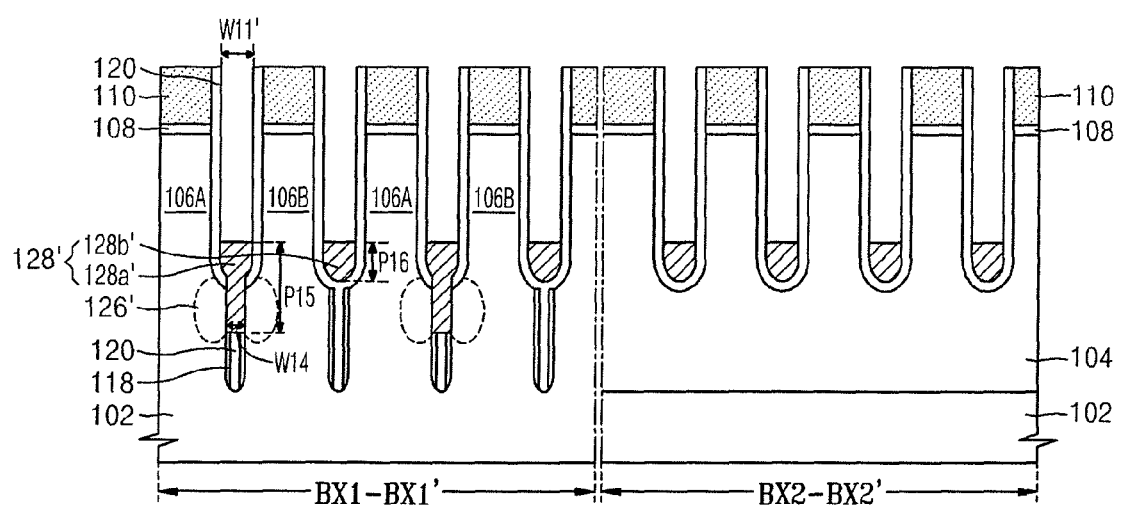

Referring to FIGS. 17A and 17B, the substrate 102, in which the first source/drain areas 126' are formed, is cleaned and then, a barrier layer (not illustrated) may be formed on the substrate 102. In the cleaning process, the second mask patterns 122' may be removed. In the current embodiment of the inventive concept, the barrier layer may include, for example, Ti, TiN, or the like and may be formed by, for example, a deposition process.

Then, the plurality of first and second buried bit lines 128a' and 128b' may be formed in the extended first main trenches 112a and second main trenches 112b, respectively. In the current embodiment of the inventive concept, the first and second buried bit lines 128a' and 128b' may each include a metal material, such as, for example, W, Ta, or the like, a nitride thereof, silicide thereof, or doped polysilicon, and may be formed by, for example, a deposition process. For example, the fifth depths P15 of the first buried bit lines 128a' formed in the extended first main trenches 112a may be about 1000 Å, and the sixth depths P16 of the second buried bit lines 128b' formed in the extended second main trenches 112b may be about 500 Å.

In one active area 106 illustrated in FIG. 17B, the fifth depths P15 of the first buried bit lines 128a' may be, for example, larger than the sixth depths P16 of the second buried bit lines 128b'. Although not illustrated, in the other active area 106 that is adjacent to the active area 106, the sixth depth P16 of the second buried bit lines 128b' may be, for example, larger than the fifth depths P15 of the first buried bit lines 128a'.

In the current embodiment of the inventive concept, widths of the buried bit lines 128a' may vary at upper surfaces and lower surfaces thereof. For example, widths W11' of the first buried bit lines 128a' at the upper surfaces thereof may be larger than widths W14 of the first buried bit lines 128a' at the lower surfaces thereof. For example, the width W11' of the first buried bit line 128a' at the upper surface thereof may be about 20 nm and the width W14 of the first buried bit line 128a' at the lower surface thereof may be about 12 nm.

Then, a planarization process is performed so that the second insulation layers 120 formed on the substrate 102 may be removed.

Figure 18A:
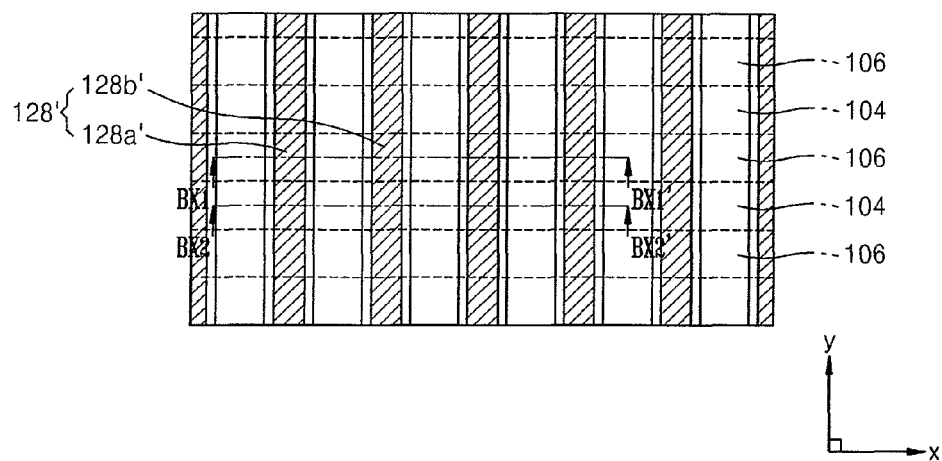
Figure 18B:
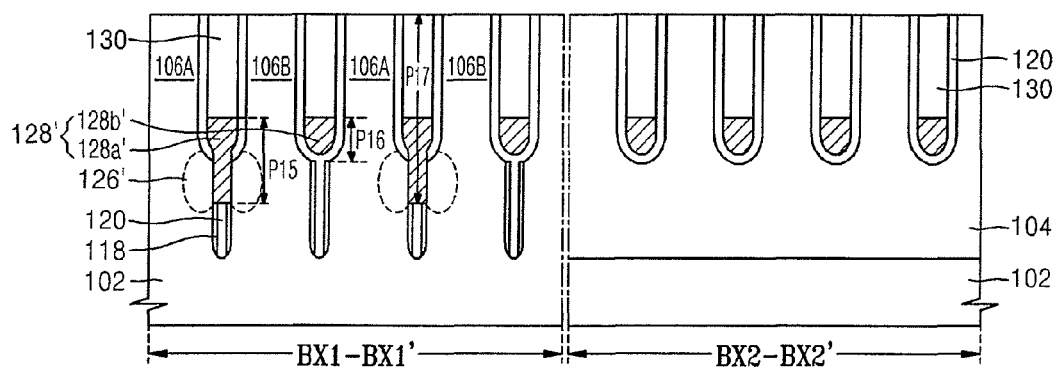

Referring to FIGS. 18A and 18B, the third insulation layer 130 that fills the extended first main trenches 112a and second main trenches 112b may be formed. In the current embodiment of the inventive concept, the third insulation layer 130 may include, for example, a silicon nitride and may be formed by, for example, a deposition process.

Then, a planarization process is performed so that the pad oxide film patterns 108 and the first mask patterns 110 each formed on the substrate 102 may be removed. Accordingly, the seventh depth P17 from the upper surface of the substrate 102 to the bottoms of the first buried bit lines 128a' may be, for example, about 3500 Å.

A series of processes described with reference to FIGS. 13A, 13B, and 13C are performed with respect to the resultant of FIGS. 18A and 18B, thereby completing manufacture of the semiconductor device 100' according to the current embodiment of the inventive concept.

As described above, according to the methods of manufacturing the semiconductor device 100' according to exemplary embodiments of the inventive concept, although misaligning may occur while performing a photolithography process for forming the second mask patterns 122', widths of the plurality of active pillars 106A and 106B may each be uniform. For example, the main trenches 112 and the sub-trenches 116 are formed after the active areas 106 are formed in the line form so that width dispersion of the active pillars due to misaligning may be reduced.

Figure 19:
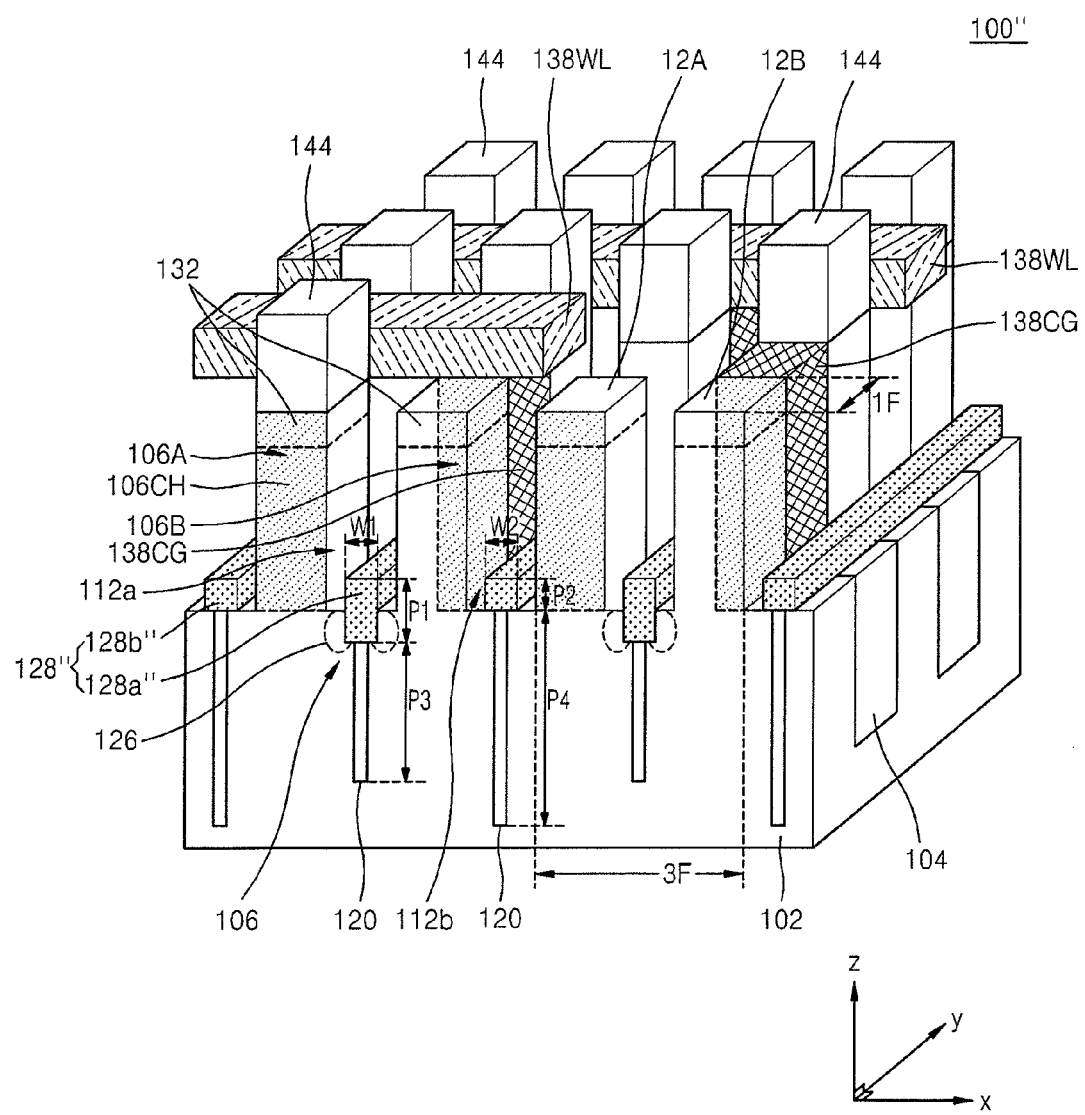
FIG. 19 is a partial perspective view illustrating the three-dimensional arrangement relationship between elements forming a cell array area in a semiconductor device according to an exemplary embodiment of the inventive concept.

FIG. 19 is a partial perspective view illustrating the three-dimensional arrangement relationship between elements forming a cell array area in a semiconductor device 100" according to an embodiment of the inventive concept.

Referring to FIG. 19, the semiconductor device 100" according to the current embodiment of the inventive concept is a modification of the semiconductor device 100 of FIG. 2A. Accordingly, detailed description about the same elements will be omitted and only differences will be described.

In the current embodiment of the inventive concept, a plurality of buried bit lines 128" may each include first and second buried bit lines 128a" and 128b", and depths from upper surfaces to lower surfaces of the first and second buried bit lines 128a" and 128b" may be different from each other according to positions thereof.

For example, the first depth P1 of the first buried bit line 128a" may be larger than the second depth P2 of the second buried bit line 128b" in one active area 106. For example, the first depth P1 may be double the second depth P2. Also, the first depth P1 may, for example, be smaller than the second depth P2 in the other active area 106 adjacent to the one active area 106. In addition, for example, the first buried bit line 128a" and the second buried bit line 128b" may each have uniform width, and the first width W1 of the first buried bit line 128a" may be substantially the same as the second width W2 of the second buried bit line 128b".

A plurality of buried insulation layers 120 may be disposed at bottoms of the first and second buried bit lines 128a" and 128b". The plurality of buried insulation layers 120 may include first buried insulation layers 120 disposed at the bottom of the first buried bit lines 128a" and the second buried insulation layers 120 disposed at the bottom of the second buried bit lines 128b", and depths from the upper surfaces to the lower surfaces of the first 120 and second 120 buried insulation layers may be different from each other according to positions thereof.

Here, an area where the active area 106 crosses with the first buried bit line 128a" and an area where the other active area 106 crosses with the second buried bit line 128b" may correspond to contact areas. Also, an area where the active area 106 crosses with the second buried insulation layer 120 and an area where the other active area 106 crosses with the first buried insulation layer 120 may correspond to field areas. Accordingly, the active areas 106 disposed at both sides of the field area may be insulated from each other.

According to the current embodiment of the inventive concept, the first 120 and second 120 buried insulation layers may function as the field areas according to the positions thereof so that an additional device isolation layer may not be formed in an extending direction of the active areas 106. Accordingly, a trim photoresist process for the active areas 106 is not required and thus an overall manufacturing process may be simplified.

Unlike the semiconductor device 100 of FIG. 2A, bottoms of the first 120 and second 120 buried insulation layers may be arranged differently in the semiconductor device 100" according to the current embodiment of the inventive concept. For example, in the substrate 102, the bottom of the second buried insulation layer 120 may be deeper than the bottom of the first buried insulation layer 120. Accordingly, an insulation effect between the active areas 106 disposed at both sides of the second buried insulation layer 120 may increase.

FIGS. 20A through 25B are schematic diagrams sequentially illustrating a method of manufacturing the semiconductor device 100" of FIG. 19, according to an embodiment of the inventive concept. In particular, FIGS. 20A, 21A, . . . , and 25A are plane views of an area of a rectangle "P" in FIG. 1. FIGS. 20B, 21B, . . . , and 25B are cross-sectional views of the area along lines BX1-BX1' and BX2-BX2' of FIGS. 20B, 21B, . . . , and 25B.

Embodiments described with reference to FIGS. 20A through 25B are similar to the methods described with reference to FIGS. 3A through 13C. Thus, only differences therebetween will be described below.

Figure 20A:
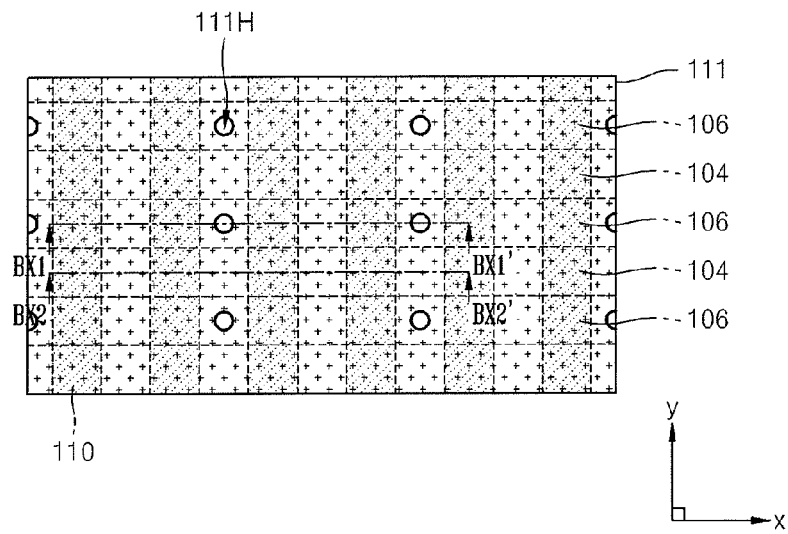
FIGS. 20A through 25B are schematic diagrams sequentially illustrating a method of manufacturing the semiconductor device of FIG. 19, according to an exemplary embodiment of the inventive concept.
Figure 20B:
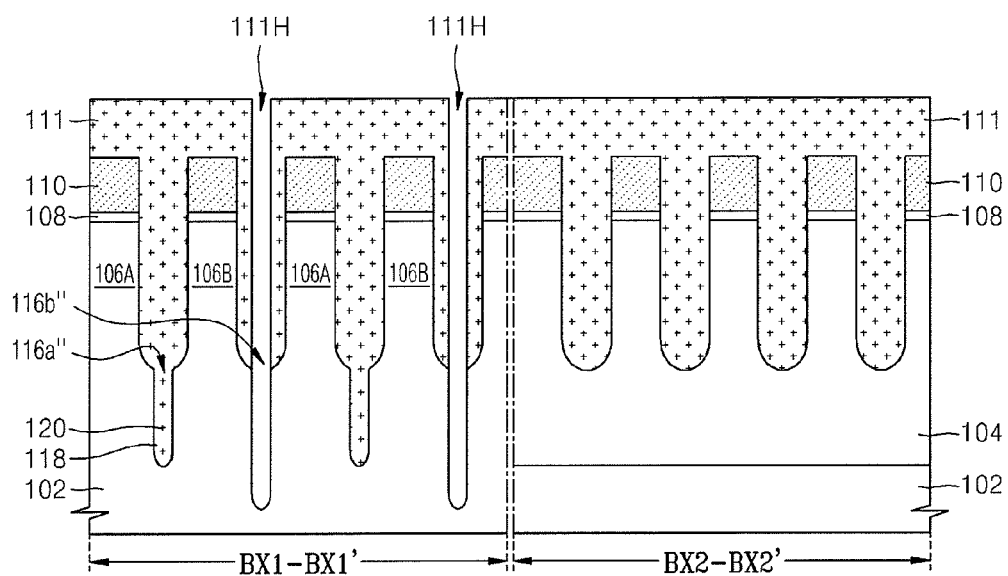

Referring to FIGS. 20A and 20B, the plurality of sub-trenches 116 are formed in the substrate 102 according to a series of processes described with reference to FIGS. 3A through 7C.

Then, mask patterns 111 may be formed on the substrate 102, in which first and second sub-trenches 116a" and 116b" are formed. For example, a mask layer that fills the inside of the plurality of main trenches 112 is formed, the formed mask layer is patterned, the first sub-trenches 116a" are filled, and thereby the mask patterns 111 having a plurality of openings 111H that expose the second sub-trenches 116b" may be formed.

Then, the mask patterns 111 may be used as etching masks so as to further etch the second sub-trenches 116b" by a predetermined depth. Accordingly, depths of the second sub-trenches 116b" may be, for example, deeper than depths of the first sub-trenches 116a". In other words, the bottoms of the second sub-trenches 116b" may be formed to be deeper than the bottoms of the first sub-trenches 116a" in the substrate 102.

Then, the mask patterns 111 may be removed and thereby, the first sub-trenches 116a" and the second sub-trenches 116b" may be exposed.

Figure 21A:
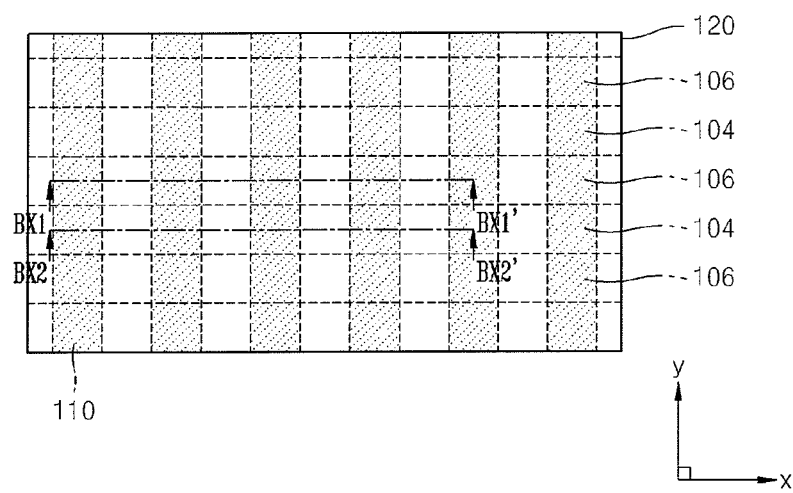
Figure 21B:
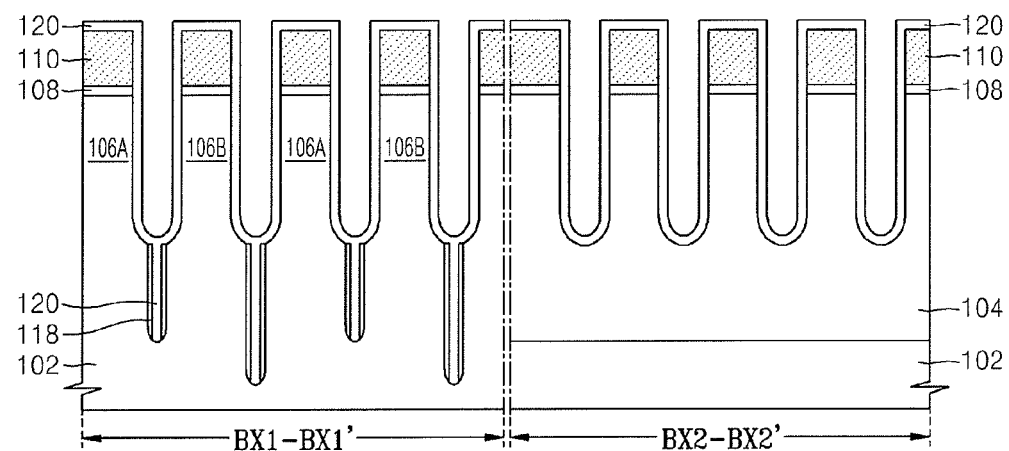

Referring to FIGS. 21A and 21B, the side wall insulation layers 118 may be formed on inner walls of the first and second sub-trenches 116a" and 116b". The side wall insulation layers 118 may facilitate the forming of the second insulation layer 120. In the current embodiment of the inventive concept, the side wall insulation layers 118 may each include, for example, an oxide layer and may be formed by, for example, radical oxidization. For example, the side wall insulation layers 118 may each have a thickness of about 30 Å.

Then, the second insulation layer 120 for completely filling the first and second sub-trenches 116a" and 116b" may be formed. The second insulation layer 120 may be referred to as a buried insulation layer. In the current embodiment of the inventive concept, the second insulation layer 120 may include, for example, a silicon nitride and may be formed by, for example, a deposition process, such as ALD, CVD, or PVD. For example, the second insulation layer 120 may have a thickness of about 50 Å.

Figure 22A:
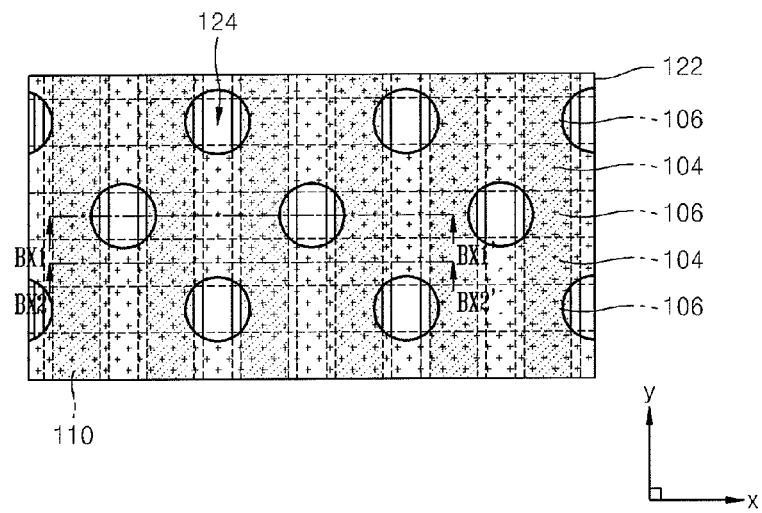
Figure 22B:
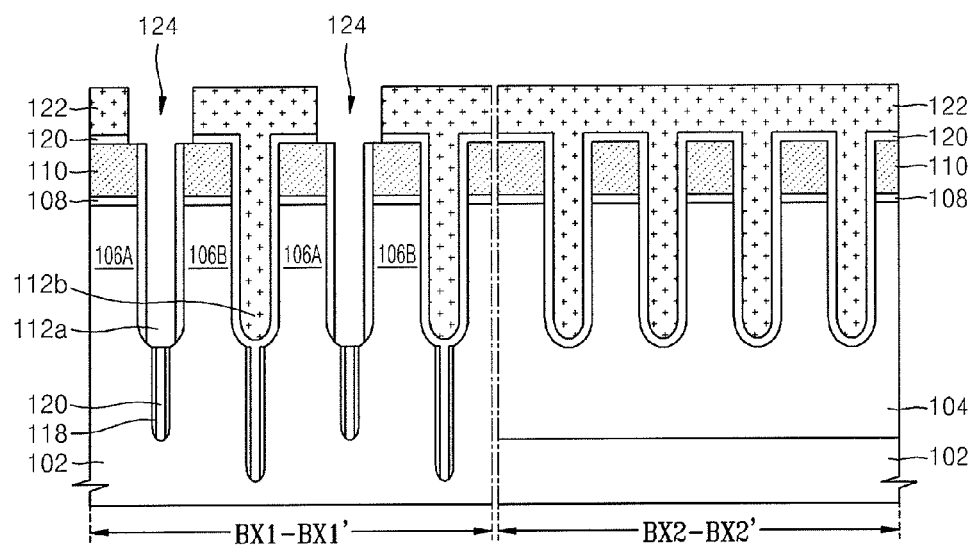

Referring to FIGS. 22A and 22B, the second mask patterns 122 may be formed on the substrate 102, on which the second insulation layer 120 is formed. For example, a mask layer that fills the inside of the first and second main trenches 112a and 112b and covers the second insulation layer 120 is formed, the formed mask layer is patterned, and thereby the second mask patterns 122 having the plurality of openings 124 that expose the second insulation layer 120 at some lower surfaces of the first and second main trenches 112a and 112b may be formed. However, exemplary embodiments of the inventive concept are not limited thereto but rather alternatively the width of the plurality of openings 124 in the second mask patterns 122 may be small so as to not partially expose the second insulation layer 120 formed at the bottoms of the first and second main trenches 112a and 112b.

In the current embodiment of the inventive concept, the second mask patterns 122 may partially expose areas where a first active area 106 as one of the plurality of active areas 106 crosses with the first main trenches 112a and areas where a second active area 106 disposed adjacent to the first active area 106 from among the plurality of active areas 106 crosses with the second main trenches 112b. For example, the second mask patterns 122 may expose the areas where the active area 106 crosses with the first main trenches 112a in FIG. 22B. Although not illustrated, the second mask patterns 122 may expose the areas where the other active area 106 that is adjacent to the active area 106 crosses with the second main trenches 112b.

Then, the second insulation layer 120 exposed through the second mask patterns 122 and the plurality of openings 124 is used as an etching mask so as to etch the second insulation layers 120 formed in each of the first main trenches 112a. Here, the second insulation layer 120 on the first mask patterns 110 and the second insulation layer 120 on the device isolation layer 104 each exposed by the second mask patterns 122 may be partially etched.

Figure 23A:
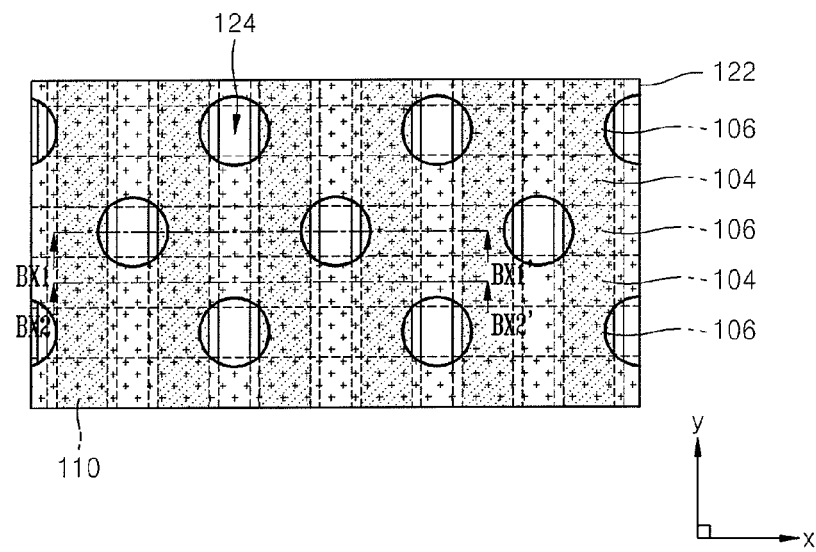
Figure 23B:
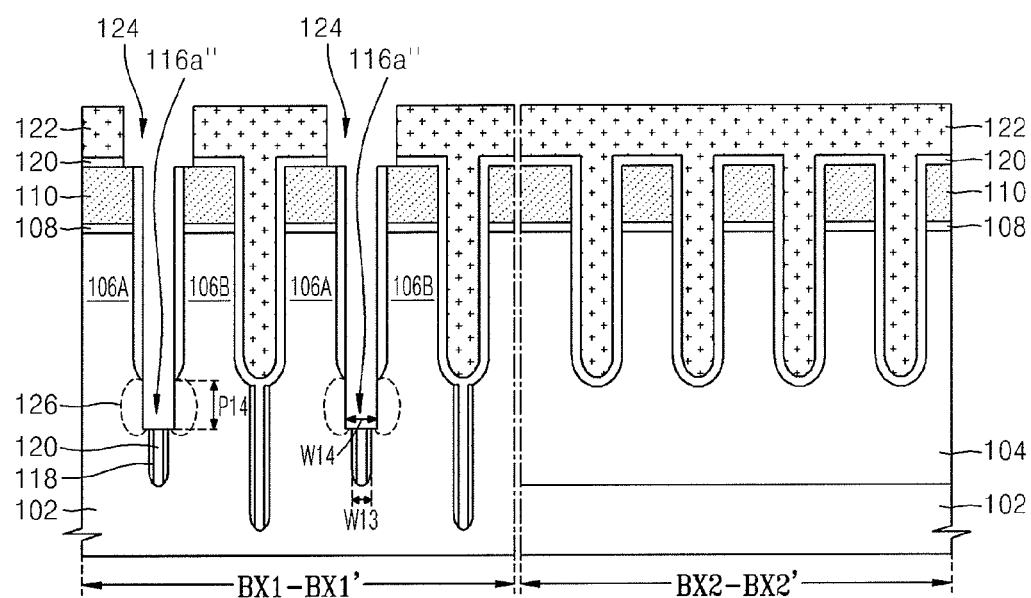

Referring to FIGS. 23A and 23B, the second insulation layer 120 exposed through the second mask patterns 122 and the plurality of openings 124 is used as an etching mask so as to etch the second insulation layers 120 and the side wall insulation layers 118 each formed in the first sub-trenches 116a", and some active areas 106 adjacent to the first sub-trenches 116a" by the fourth depth P14 and thus, the substrate 102, that is, some of the active areas 106, may be exposed. Here, although the substrate 102 is partially exposed, the second insulation layer 120 disposed in a lower portion of the substrate 102 may remain.

Accordingly, the first main trenches 112a may be extended by the fourth depth P14, and the fourth depth P14 may be, for example, about 500 Å. The fourth widths W14 of the first main trenches 112a may be, for example, larger than the third widths W13 of the first and second sub-trenches 116a" and 116b". For example, the fourth width W14 may be about 20 nm and the third width W13 may be about 12 nm.

Then, impurity ions are injected into the active areas 106 through the plurality of openings 124 so that the first source/drain areas 126 may be formed in the exposed active areas 106. For example, the impurity ions may include N-type impurity ions. However, exemplary embodiments of the inventive concept are not limited thereto.

In one active area 106 illustrated in FIG. 23B, the active areas 106 are exposed at the bottoms of the first main trenches 112a and thereby, the first source/drain areas 126 may be formed in the exposed active areas 106. Although not illustrated, in the other active area 106 that is adjacent to the active area 106, the active areas 106 are exposed at the bottoms of the second main trenches 112b and thereby, the first source/drain areas 126 may be formed in the exposed active areas 106.

Figure 24A:
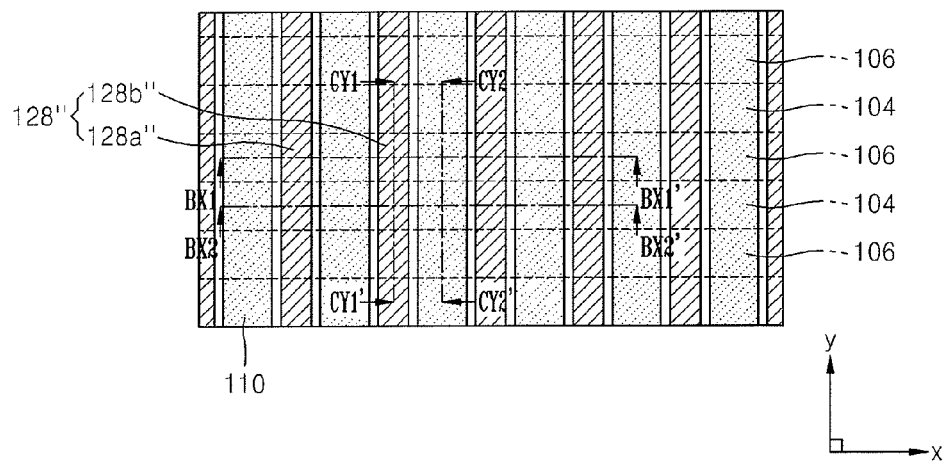
Figure 24B:
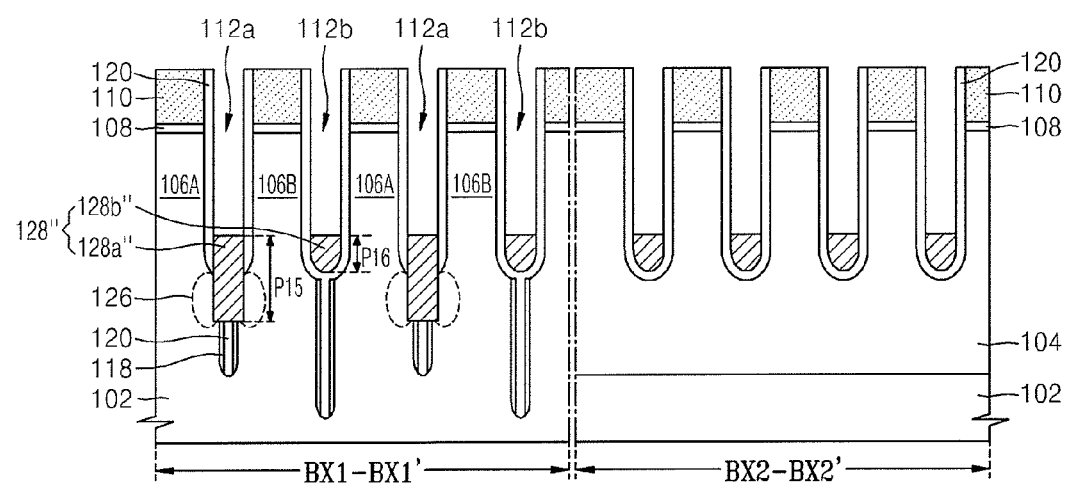

Referring to FIGS. 24A and 24B, the substrate 102, in which the first source/drain areas 126 are formed, is cleaned and then, a barrier layer (not illustrated) may be formed on the substrate 102. In the cleaning process, the second mask patterns 122 may be removed. In the current embodiment of the inventive concept, the barrier layer may include, for example, Ti, TiN, or the like and may be formed by, for example, a deposition process.

Then, a plurality of first and second buried bit lines 128a" and 128b" may be formed in the extended first main trenches 112a and second main trenches 112b, respectively. In the current embodiment of the inventive concept, the first and second buried bit lines 128a" and 128b" may each include a metal material, such as, for example, W, Ta, or the like, a nitride thereof, silicide thereof, or doped polysilicon, and may be formed by, for example, a deposition process. For example, the fifth depths P15 of the first buried bit lines 128a" formed in the extended first main trenches 112a may be about 1000 Å, and the sixth depths P16 of the second buried bit lines 128b" formed in the extended second main trenches 112b" may be about 500 Å.

In one active area 106 illustrated in FIG. 24B, the fifth depths P15 of the first buried bit lines 128a" may be, for example, larger than the sixth depths P16 of the second buried bit lines 128b". Although not illustrated, in the other active area 106 that is adjacent to the active area 106, the sixth depth P16 of the second buried bit lines 128b" may be, for example, larger than the fifth depths P15 of the first buried bit lines 128a".

Then, a planarization process is performed so that the second insulation layers 120 formed on the substrate 102 may be removed.

Figure 25A:
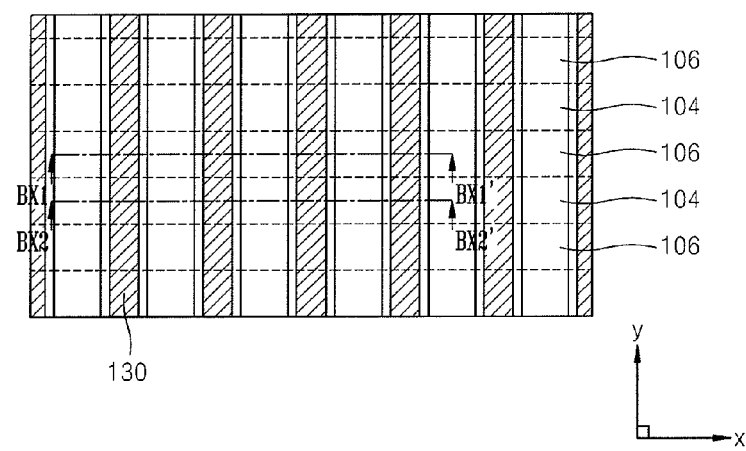
Figure 25B:
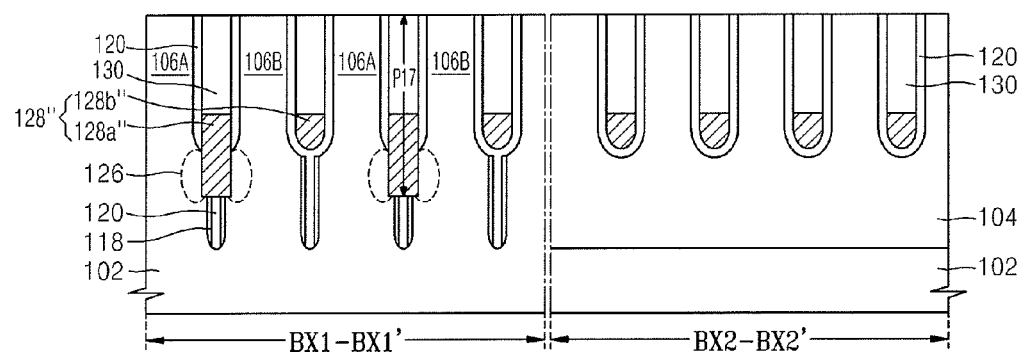

Referring to FIGS. 25A and 25B, the third insulation layer 130 that fills the extended first main trenches 112a and second main trenches 112b may be formed. In the current embodiment of the inventive concept, the third insulation layer 130 may include, for example, a silicon nitride and may be formed by, for example, a deposition process, such as ALD, CVD, or PVD.

Then, a planarization process is performed so that the pad oxide film patterns 108 and the first mask patterns 110 each faulted on the substrate 102 may be removed. Accordingly, the seventh depth P17 from the upper surface of the substrate 102 to the bottoms of the first buried bit lines 128a" may be, for example, about 3500 Å.

A series of processes described with reference to FIGS. 13A, 13B, and 13C are performed with respect to the resultant of FIGS. 25A and 25B, thereby completing manufacture of the semiconductor device 100" according to the current embodiment of the inventive concept.

As described above, according to a method of manufacturing the semiconductor device 100" according to exemplary embodiments of the embodiments of the inventive concept, although misaligning may occur while performing a photolithography process for forming the second mask patterns 122, widths of the plurality of active pillars 106A and 106B may each be uniform. For example, the main trenches 112 and the sub-trenches 116 are formed after the active areas 106 are formed in the line form so that width dispersion of the active pillars due to misaligning may be reduced.

Also, the depth of the second insulation layer 120 disposed on the bottoms of the second buried bit lines 128b" is deeper than the depth of the second insulation layer 120 disposed on the bottoms of the first buried bit lines 128a" so that two adjacent single active areas, that is, active areas disposed at both sides of the second insulation layer 120 disposed on the bottoms of the second buried bit lines 128b" may be efficiently insulated from each other.

Figure 26:
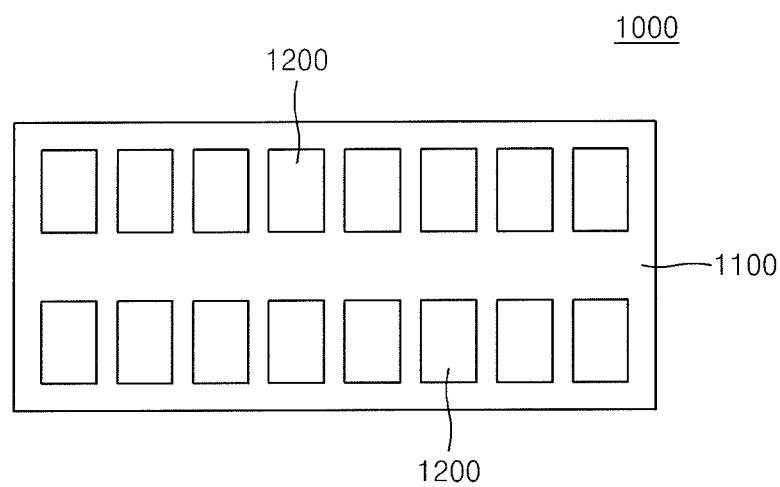
FIG. 26 is a schematic plan view of a memory module including a semiconductor device, according to an exemplary embodiment of the inventive concept.

FIG. 26 is a schematic plan view of a memory module 1000 including a semiconductor device, according to an exemplary embodiment of the inventive concept.

Referring to FIG. 26, the memory module 1000 may include, for example, a printed circuit board 1100 and a plurality of semiconductor packages 1200.

The plurality of semiconductor packages 1200 may include a semiconductor device according to the embodiment of the inventive concept. In particular, the plurality of semiconductor packages 1200 may include a structure of at least one of the semiconductor devices of the above-described embodiments in FIGS. 2A, 14, and 19.

The memory module 1000 according to the current embodiment of the inventive concept may be, for example, a single in-lined memory module (SIMM) or a dual in-lined memory module (DIMM), and the SIMM includes the plurality of semiconductor packages 1200 on one side of a printed circuit board and the DIMM includes the plurality of semiconductor packages 1200 on both sides thereof. Also, the memory module 1000 according to the current embodiment of the inventive concept may be a fully buffered DIMM having an advanced memory buffer (AMB) that provides signals from the outside to each of the plurality of semiconductor packages 1200.

Figure 27:
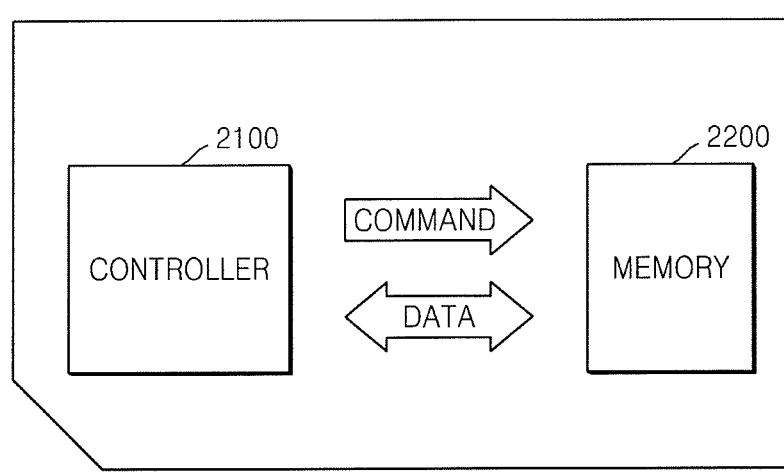
FIG. 27 is a schematic diagram of a memory card including a semiconductor device, according to an exemplary embodiment of the inventive concept.

FIG. 27 is a schematic diagram of a memory card 2000 including a semiconductor device, according to an exemplary embodiment of the inventive concept.

Referring to FIG. 27, the memory card 2000 may be disposed so that a controller 2100 may communicate an electric signal with a memory 2200. For example, when a command is provided from the controller 2100, the memory 2200 may transmit data.

The memory 2200 may include a semiconductor device according to exemplary embodiments of the inventive concept. In particular, the memory 2200 may include a structure of at least one of the semiconductor devices of the above-described embodiments in FIGS. 2A, 14, and 19.

The memory card 2000 may include various types of memory cards, for example, a memory stick card, a smart media (SM) card, a secure digital (SD) card, mini SD card, or a multimedia card (MMC).

Figure 28:
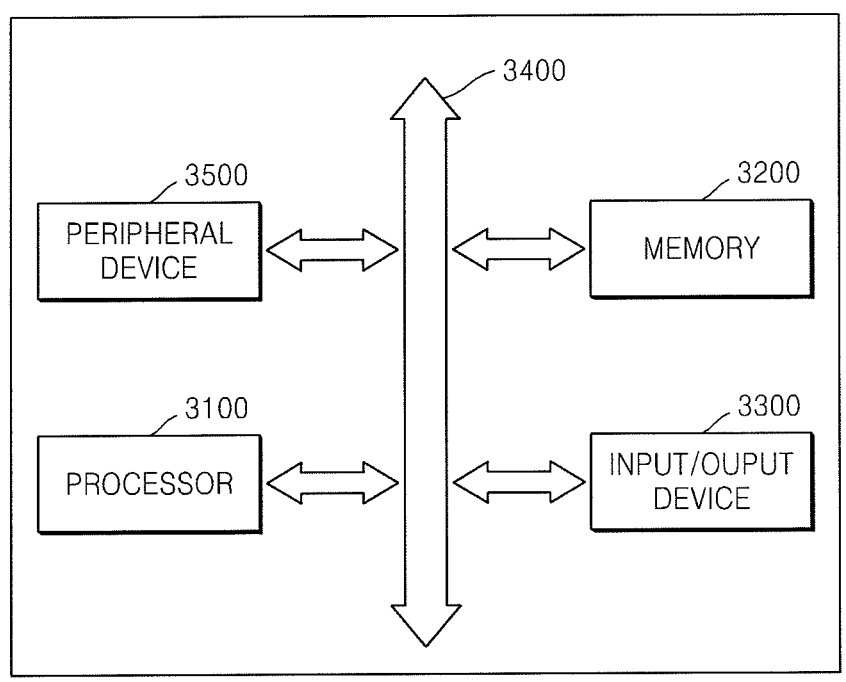
FIG. 28 is a schematic diagram of a system including a semiconductor device, according to an exemplary embodiment of the inventive concept.

FIG. 28 is a schematic diagram of a system 3000 including a semiconductor device, according to an embodiment of the inventive concept.

Referring to FIG. 28, in the system 3000, a processor 3100, a memory 3200, and an input/output device 3300 may communicate data with each other via, for example, a bus 3400.

The memory 3200 of the system 3000 may include, for example, a random access memory (RAM) or a read only memory (ROM). Also, the system 3000 may include, for example, a peripheral device 3500, such as a floppy disk drive or a compact disk (CD) ROM drive.

The memory 3200 may include a semiconductor device according to exemplary embodiments of the inventive concept. In particular, the memory 3200 may include a structure of at least one of the semiconductor devices of the above-described embodiments in FIGS. 2A, 14, and 19.

The memory 3200 may store codes and data for operating the processor 3100. The system 3000 may be used in, for example, mobile phones, MP3 players, navigations, portable multimedia players (PMP), solid state disks (SSD), or household appliances.

Having described exemplary embodiments of the inventive concept, it is further noted that it is readily apparent to those of reasonable skill in the art that various modifications may be made without departing from the spirit and scope of the invention which is defined by the metes and bounds of the appended claims.

What is claimed is:

1. A method of manufacturing a semiconductor device, the method comprising:
    defining a first active area and a second active area on a substrate, the first and second active areas being in a line form extended in parallel to each other in a first direction;
    forming a first main trench and a second main trench on the substrate, the first and second main trenches being extended in parallel to each other in a second direction that is perpendicular or substantially perpendicular to the first direction;
    forming a first sub-trench and a second sub-trench in bottoms of the first and second main trenches, respectively, the first and second sub-trenches being extended in parallel to each other in the second direction;
    forming a buried insulation layer filling the first and second sub-trenches;
    partially exposing the substrate at an area where the first active area crosses with the first sub-trench and an area where the second active area crosses with the second sub-trench while the buried insulation layer remains below the area where the first active area crosses with the first sub-trench and the area where the second active area crosses with the second sub-trench; and
    forming a first buried bit line and a second buried bit line on the buried insulation layer, the first and second buried bit lines being extended in parallel to each other in the second direction.

2. The method of claim 1, wherein a width of each of the first and second sub-trenches is smaller than a width of each of the first and second main trenches.

3. The method of claim 1, wherein an area where the first active area crosses with the first buried bit line and an area where the second active area crosses with the second buried bit line correspond to contact areas, and the buried insulation layer formed on an area where the first active area crosses with the second sub-trench and an area where the second active area crosses with the first sub-trench corresponds to field areas.

4. The method of claim 1, wherein the first buried bit line is formed on the buried insulation layer in the first sub-trench in the first active area and the second buried bit line is formed on the buried insulation layer in the second sub-trench in the second active area, wherein a depth from an upper surface to a lower surface of the first buried bit line is larger than a depth from an upper surface to a lower surface of the second buried bit line.

5. The method of claim 1, further comprising forming a first insulation layer having a first thickness on inner side walls of the first and second main trenches before the forming of the first and second sub-trenches.

6. The method of claim 1, further comprising forming side wall insulation layers on inner side walls of the first and second sub-trenches before forming the buried insulation layer.

7. The method of claim 1, wherein the partially exposing of the substrate at the area where the first active area crosses with the first sub-trench and the area where the second active area crosses with the second sub-trench while the buried insulation layer remains below the areas comprises:
    forming a mask pattern on the substrate, on which the buried insulation layer is formed, for partially exposing an area where the first active area crosses with the first main trench and an area where the second active area crosses with the second main trench; and
    removing the buried insulation layer by a first depth by using the mask pattern as an etching mask at the area where the first active area crosses with the first sub-trench and the area where the second active area crosses with the second sub-trench.

8. The method of claim 7, wherein the partially exposing of the substrate at the area where the first active area crosses with the first sub-trench and the area where the second active area crosses with the second sub-trench while the buried insulation layer remains below the area where the first active area crosses with the first sub-trench and the area where the second active area crosses with the second sub-trench further comprises removing the buried insulation layer exposed on bottoms of the first main trench and the second main trench at an area where the first active area crosses with the first main trench and the area where the second active area crosses with the second main trench.

9. The method of claim 8, wherein the partially exposing of the substrate at the area where the first active area crosses with the first sub-trench and the area where the second active area crosses with the second sub-trench while the buried insulation layer remains below the area where the first active area crosses with the first sub-trench and the area where the second active area crosses with the second sub-trench further comprises partially removing the substrate adjacent to each of the first and second sub-trenches by the first depth at the area where the first active area crosses with the first sub-trench and the area where the second active area crosses with the second sub-trench.

10. The method of claim 7, further comprising forming first source/drain areas by injecting impurities to the bottoms of the first main trench in the first active area and the second main trench in the second active area each exposed by the mask pattern.

11. The method of claim 10, further comprising dividing each of the first and second active areas into a plurality of active pillars by the first and second main trenches and forming second source/drains areas by injecting the impurities to upper surfaces of the plurality of active pillars.

12. The method of claim 11, further comprising:
    forming a gate insulation layer on one vertical side of each of the plurality of active pillars; and
    forming a contact gate that faces the vertical side of one of the plurality of active pillars, the gate insulation layer being interposed between the contact gate and the vertical side of the one of the plurality of active pillars, and a word line connected to the contact gate and disposed on the substrate.

13. A method of manufacturing a semiconductor device, the method comprising:
    defining a first area and a second active area on a substrate, the first and second active areas being in a line form extended in parallel to each other in a first direction;
    forming a first main trench and a second main trench on the substrate, the first and second main trenches being extended in parallel to each other in a second direction that is perpendicular or substantially perpendicular to the first direction;

forming a first sub-trench and a second sub-trench on bottoms of the first and second main trenches, respectively, the first and second sub-trenches being extended in parallel to each other in the second direction;

further etching the first and second sub-trenches by a first depth at an area where the first active area crosses with the second sub-trench and an area where the second active area crosses with the first sub-trench;

forming a buried insulation layer filling the first and second sub-trenches;

partially exposing the substrate at an area where the first active area crosses with the first sub-trench and an area where the second active area crosses with the second sub-trench while the buried insulation layer remains below the area where the first active area crosses with the first sub-trench and the area where the second active area crosses with the second sub-trench; and forming a first buried bit line and a second buried bit line on the buried insulation layer, the first and second buried bit lines being extended in parallel to each other in the second direction.

14. The method of claim 13, wherein a width of each of the first and second sub-trenches is smaller than a width of each of the first and second main trenches.

15. The method of claim 14, further comprising forming a first insulation layer having a first thickness on inner side walls of the first and second main trenches before forming of the first and second sub-trenches.

16. A method of manufacturing a semiconductor device, the method comprising:

forming a device isolation layer in a substrate defining a first active area and a second active area on the substrate, the first and second active areas being in a line form extended in parallel to each other in a first direction;

sequentially forming a pad oxide film pattern and a first mask pattern each extended in parallel to each other in a second direction that is perpendicular or substantially perpendicular to the first direction on the device isolations layer and the first and second active areas;

etching exposed portions of the device isolation layer and the first and second active areas using the first mask pattern as an etching mask to form a first main trench and a second main trench in the substrate, wherein the first and second main trenches being extended in parallel to each other in a second direction that is perpendicular or substantially perpendicular to the first direction and wherein the first and second active areas are divided into a plurality of active pillars by the first and second main trenches;

forming a first insulation layer on the first mask pattern and in each of the first and second main trenches;

removing exposed portions of the first insulation layer located on bottoms of the first and second main trenches and exposed portions of the first insulation layer located underneath the first mask patterns;

over-etching the substrate using the first insulation layer remaining on sidewalls of the first and second main trenches as etching masks to thereby form a first sub-trench and a second sub-trench connected to and in bottoms of the first and second main trenches, respectively, the first and second sub-trenches being extended in parallel to each other in the second direction;

removing the first insulation layer remaining on the sidewalls of the first and second main trenches;

forming sidewall insulation layers on inner walls of the first and second sub-trenches;

forming a second insulation layer on sidewalls of the first and second main trenches and along the sidewall insulation layers in the first and second sub-trenches to fill the first and second sub-trenches;

forming a second mask pattern having an opening on the second insulation layer, wherein the opening partially exposes the substrate at an area where the first active area crosses with the first main-trench and an area where the second active area crosses with the second main trench;

etching the second insulating layer formed at a bottom of the first main trench exposed by the second mask pattern and the opening;

etching portions of the second insulating layer and the sidewall insulation layer each formed in the first sub-trench to thereby extend a depth of the first main trench and to expose the first active area adjacent to the first sub-trench;

implanting impurity ions into the exposed first active area though the opening in the second mask pattern so that first source/drain areas are formed in the exposed first active area;

removing the second mask pattern;

forming a first buried bit line and a second buried bit line in each of the first main trench and the second main trench above the sidewall insulation layers and the second insulation layer formed in the first sub-trench and the second sub-trench, forming a third insulation layer on the first and second buried bit lines to thereby fill the first main trench and the second main trench;

removing the pad oxide film pattern and the first mask pattern from the substrate; and forming second source/drains areas by injecting the impurities to upper surfaces of the plurality of active pillars.

17. The method of claim 16, wherein the opening of the second mask pattern exposes the second insulation layer formed on the sidewalls of the first main trench, and wherein the second insulation layer formed on the sidewalls of the first main trench and the opening are used as an etching mask to etch the portions of the second insulation layer and the sidewall insulation layers formed in the first sub-trench and wherein a width of the first main trench formed is larger than a width of the first and second sub-trenches.

18. The method of claim 16, wherein the second mask pattern extends into the first main trench and covers the second insulation layer formed on the sidewalls of the first main trench such that the opening of the second mask pattern is not of a sufficient size to expose any portion of the second insulation layer formed on the sidewalls of the first main trench, wherein the etching portions of the second insulating layer formed at the bottom of the first main trench exposed by the second mask pattern and the opening is performed using the second mask pattern as an etch mask, and wherein a width of the first main trench formed is substantially the same as a width of the first and second sub-trenches.

19. The method of claim 16, wherein after removing the first insulating layer remaining on the sidewalls of the first and second main trenches and prior to the forming the sidewall insulation layers and the second insulation layer, the method further comprises etching the second sub-trench to a depth which is deeper than a depth of the first sub-trench.

20. The method of claim 16, wherein the first and second main trenches have equal intervals therebetween along the first direction as an extending direction of the first and second active areas in the substrate, and wherein a width of each of the first and second main trenches is larger than a width of each of the plurality of active pillars.

* * * * *